United States Patent
Le et al.

(10) Patent No.: US 8,500,975 B2
(45) Date of Patent: *Aug. 6, 2013

(54) METHOD AND APPARATUS FOR SPUTTERING ONTO LARGE FLAT PANELS

(75) Inventors: Hien Minh Huu Le, San Jose, CA (US); Akihiro Hosokawa, Cupertino, CA (US); Avi Tepman, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2186 days.

This patent is subject to a terminal disclaimer.

(21) Appl. No.: 11/484,333

(22) Filed: Jul. 11, 2006

(65) Prior Publication Data

US 2007/0012562 A1    Jan. 18, 2007

Related U.S. Application Data

(63) Continuation-in-part of application No. 11/211,141, filed on Aug. 24, 2005, now abandoned, which is a continuation-in-part of application No. 10/863,152, filed on Jun. 7, 2004, now Pat. No. 7,513,982.

(60) Provisional application No. 60/534,952, filed on Jan. 7, 2004, provisional application No. 60/702,327, filed on Jul. 25, 2005, provisional application No. 60/705,031, filed on Aug. 2, 2005.

(51) Int. Cl.
*C25B 9/00* (2006.01)
*C25B 11/00* (2006.01)
*C25B 13/00* (2006.01)
*C23C 14/00* (2006.01)

(52) U.S. Cl.
USPC ............ 204/298.16; 204/298.17; 204/298.19; 204/298.2

(58) Field of Classification Search
USPC ............... 204/298.2, 298.29, 192.12, 298.16, 204/298.17, 298.19
See application file for complete search history.

(56) References Cited

U.S. PATENT DOCUMENTS

| 3,878,085 A | | 4/1975 | Corbani ........................ 204/298 |
| 4,247,383 A | * | 1/1981 | Greve et al. .............. 204/298.16 |

(Continued)

FOREIGN PATENT DOCUMENTS

| DE | 2707144 | 2/1977 |
| DE | 19701575 | 7/1998 |

(Continued)

OTHER PUBLICATIONS

Office Action dated Aug. 22, 2008 for Chinese Patent Application No. 200510004072.4.

(Continued)

*Primary Examiner* — Michael Band
(74) *Attorney, Agent, or Firm* — Patterson & Sheridan, LLP

(57) ABSTRACT

A rectangular magnetron placed at the back of a rectangular sputtering target for coating a rectangular panel and having magnets of opposed polarities arranged to form a gap therebetween corresponding to a plasma track adjacent the target which extends in a closed serpentine or spiral loop. The spiral may have a large number of wraps and the closed loop may be folded before wrapping. The magnetron has a size only somewhat less than that of the target and is scanned in the two perpendicular directions of the target with a scan length of, for example, about 100 mm for a 2 m target corresponding to at least the separation of the gap between parallel portions of the loop. A central ferromagnetic shim beneath some magnets in the loop may compensate for vertical droop. The magnetron may be scanned in two alternating double-Z patterns rotated 90° between them.

19 Claims, 24 Drawing Sheets

U.S. PATENT DOCUMENTS

| | | | |
|---|---|---|---|
| 4,312,731 A | 1/1982 | Morrison, Jr. | |
| 4,426,275 A | 1/1984 | Meckel et al. | |
| 4,437,966 A | 3/1984 | Hope et al. | 204/298 |
| 4,444,643 A | 4/1984 | Garrett | 204/298.2 |
| 4,600,492 A | 7/1986 | Ooshio et al. | 204/298.2 |
| 4,631,106 A | 12/1986 | Nakazato et al. | |
| 4,714,536 A | 12/1987 | Freeman et al. | 204/298.2 |
| 4,826,584 A | 5/1989 | Ribeiro | 204/298.09 |
| 5,242,566 A | 9/1993 | Parker | 204/298.2 |
| 5,252,194 A | 10/1993 | Demaray et al. | 204/298.2 |
| 5,262,028 A | 11/1993 | Manley | |
| 5,262,030 A | 11/1993 | Potter | |
| 5,314,597 A | 5/1994 | Harra | 204/192.13 |
| 5,320,728 A | 6/1994 | Tepman | 204/192.12 |
| 5,328,585 A | 7/1994 | Stevenson et al. | 204/298.2 |
| 5,374,343 A | 12/1994 | Sasaki et al. | 204/298.2 |
| 5,382,344 A | 1/1995 | Hosokawa et al. | 204/298.2 |
| 5,458,759 A | 10/1995 | Hosokawa et al. | 204/298.2 |
| 5,565,071 A | 10/1996 | Demaray | 204/192.12 |
| 5,833,815 A | 11/1998 | Kim et al. | 204/192.12 |
| 5,855,744 A | 1/1999 | Halsey et al. | 204/192.12 |
| 5,873,989 A | 2/1999 | Hughes et al. | 204/298.2 |
| 5,876,574 A | 3/1999 | Hofmann et al. | 204/192.13 |
| 6,132,576 A * | 10/2000 | Pearson | 204/298.2 |
| 6,183,614 B1 | 2/2001 | Fu | 204/298.2 |
| 6,284,106 B1 | 9/2001 | Haag et al. | |
| 6,322,679 B1 | 11/2001 | DeBosscher et al. | 204/298.2 |
| 6,416,639 B1 | 7/2002 | DeBosscher et al. | 204/298.2 |
| 6,436,252 B1 | 8/2002 | Tzatzov et al. | |
| 6,461,485 B2 | 10/2002 | Mizouchi et al. | |
| 6,723,210 B2 | 4/2004 | Teng et al. | 204/192.15 |
| 7,186,319 B2 * | 3/2007 | Yang et al. | 204/192.12 |
| 7,513,982 B2 * | 4/2009 | Tepman | 204/298.2 |
| 2003/0146087 A1 | 8/2003 | Teng et al. | |
| 2003/0234175 A1 | 12/2003 | Teng | 204/192.12 |
| 2004/0178056 A1 * | 9/2004 | De Bosscher et al. | 204/192.12 |
| 2005/0145478 A1 | 7/2005 | Tepman | |

FOREIGN PATENT DOCUMENTS

| | | |
|---|---|---|
| EP | 0 105407 A2 | 4/1984 |
| EP | 0 858 095 | 6/1998 |
| JP | 53-7586 | 1/1978 |
| JP | 58-016078 A | 1/1983 |
| JP | 61074339 U | 5/1986 |
| JP | 61204371 A * | 9/1986 |
| JP | 2005-298966 A | 10/2005 |
| WO | WO-2007/015933 A2 | 2/2007 |
| WO | WO-2008/059814 A1 | 5/2008 |

OTHER PUBLICATIONS

Notice of First Office Action dated Sep. 9, 2010 for Chinese Patent Application No. 200680027042.8.

Japanese Office Action dated Jun. 5, 2012 for Japanese Patent Application No. 2008-523977.

Second Office Action dated Apr. 20, 2011 for Chinese Patent Application No. 200680027042.8.

Office Action dated Aug. 24, 2011 for Taiwan Patent Application No. 095126272.

Chinese Office Action dated Mar. 20, 2009, Chinese Application No. 200710166903.7.

European Office Action dated Feb. 21, 2007 for European Application No. 05000140.3-1215.

European Search Report dated Jul. 25, 2005 for European Application No. 05000140.3-2119.

Sloan, Domestic Price List, Jul. 1, 1981, pp. 1-68.

Final Office Action dated Jun. 15, 2009 for U.S. Appl. No. 11/211,141.

Notice to File a Response for Korean Patent Application No. 10-2005-0000334 dated Jul. 23, 2009.

International Search Report and Written Opinion for International Application No. PCT/US06/28178 dated Jun. 23, 2008.

Japanese Office Action dated Feb. 12, 2013 for Japanese Patent Application No. 2008-523977.

* cited by examiner

METHOD AND APPARATUS FOR SPUTTERING ONTO LARGE FLAT PANELS

RELATED APPLICATIONS

This application is a continuation in part of Ser. No. 11/211,141 filed Aug. 24, 2005, which is a continuation in part of Ser. No. 10/863,152 filed Jun. 7, 2004, which claims benefit of provisional application 60/534,952 filed Jan. 7, 2004. This application also claims benefit of provisional application 60/702,327 filed Jul. 25, 2005 and 60/705,031 filed Aug. 2, 2005, both incorporated herein by reference.

FIELD OF THE INVENTION

The invention relates generally to sputtering of materials. In particular, the invention relates to scanning of the magnetron creating a magnetic field to enhance sputtering from rectangular targets.

BACKGROUND ART

Over the past decade, the technology has been intensively developed for fabricating flat panel displays (FPDs), such as used for computer displays and more recently for television screens. Sputtering is the preferred approach in fabricating flat panels for depositing onto large generally rectangular panels of glass or polymeric panels or flexible sheets electrically conductive layers including metals such as aluminum and molybdenum and transparent conductors such as conductive metal oxides such as indium tin oxide (ITO). The completed panel may incorporate thin-film transistors, plasma displays, field emitters, liquid crystal display (LCD) elements, or organic light emitting diodes (OLEDs). Solar cells having p-n or p-i-n junctions may be similarly formed on low-cost substrates. Similar technology may be used for coating glass windows with optical layers or forming color filters on FPDs. It may also be used for fabricating solar cells, especially on lower-cost substrates. Flat panel sputtering is principally distinguished from the long developed technology of wafer sputtering by the large size of the substrates and their rectangular shape. Demaray et al. describe such a flat panel sputter reactor in U.S. Pat. No. 5,565,071, incorporated herein by reference in its entirety. Their reactor includes, as illustrated in the schematic cross section of FIG. 1, a rectangularly shaped sputtering pedestal electrode 12, which is typically electrically grounded, for holding a rectangular glass panel 14 or other substrate in opposition to a rectangular sputtering target 16 within a vacuum chamber 18. The target 16, at least the surface of which is composed of a metal to be sputtered, is vacuum sealed to the vacuum chamber 18 across an isolator 20. Typically, a layer of the material to be sputtered is bonded to a backing plate in which cooling water channels are formed to cool the target 16. A sputtering gas, typically argon, is supplied into the vacuum chamber 18 held at a pressure in the milliTorr range. Advantageously, a back chamber 22 is vacuum sealed to the back of the target 16 and vacuum pumped to a low pressure, thereby substantially eliminating the pressure differential across the target 16 and its backing plate. Thereby, the target assembly can be made much thinner. When a negative DC bias is applied to the conductive target 16 with respect to the pedestal electrode 12 or other grounded parts of the chamber such as wall shields, the argon is ionized into a plasma. The positive argon ions are attracted to the target 16 and sputter metal atoms from it. The metal atoms are partially directed to the panel 14 and deposit thereon a layer at least partially composed of the target metal. Metal oxide or nitride may be deposited in a process called reactive sputtering by additionally supplying oxygen or nitrogen into the chamber 18 during sputtering of the metal.

To increase the sputtering rate, a linear magnetron 24, also illustrated in schematic bottom view in FIG. 2, is conventionally placed in back of the target 16. It has a central pole 26 of one vertical magnetic polarity surrounded by an outer pole 28 of the opposite polarity to project a magnetic field within the chamber 18 and parallel to the front face of the target 16. The two poles 26, 28 are separated by a substantially constant gap 30 over which a high-density plasma is formed in the chamber 18 under the correct chamber conditions and flows in a close loop or track. The outer pole 28 consists of two straight portions 32 connected by two semi-circular arc portions 34. The magnetic field traps electrons and thereby increases the density of the plasma and as a result increases the sputtering rate of the target 16. The relatively small widths of the linear magnetron 24 and of the gap 30 produces a higher magnetic flux density. The closed shape of the magnetic field distribution along a single closed track forms a plasma loop generally following the gap 30 and prevents the plasma from leaking out the ends. However, the small size of the magnetron 24 relative to the target 16 requires that the magnetron 24 be linearly and reciprocally scanned across the back of the target 16 in a direction transverse to the long dimension of the linear magnetron 24. Typically, a lead screw mechanism drives the linear scan, as disclosed by Halsey et al. in U.S. Pat. No. 5,855,744 in the context of a more complicated magnetron. Although horseshoe magnets may be used, the preferred structure includes a large number of strong cylindrical magnets, for example, of NdBFe arranged in the indicated pole shapes with their orientations inverted between the two indicated polarities. Magnetic pole pieces may cover the operating faces to define the pole surfaces and a magnetic yoke bridging the two poles 26, 28 may magnetically couple the other sides of the magnets.

De Bosscher et al. have described a coupled two-dimensional scan of such a linear magnetron in U.S. Pat. Nos. 6,322,679 and 6,416,639.

The described magnetron was originally developed for rectangular panels having a size of about 400 mm×600 mm. However, over the years, the panel sizes have continued to increase, both for economy of scale and to provide larger display screens. Reactors are being developed to sputter onto panels having a size of about 2 m×2 m. One generation processes a panel having a size of 1.87 m×2.2 m and is called 40K because its total area is greater than 40,000 cm². A follow-on generation called 50K has a size of greater than 2 m on each side. The invention however can be practiced for solar cells especially when the substrate is not a glass panel but other, more economical substrates including a rolled substrate having parts sequentially presented to the sputtering apparatus. The widths of linear magnetrons are generally constrained to be relatively narrow if they are to produce a high magnetic field. As a result, for larger panels having minimum dimensions of greater than 1.8 m, linear magnetrons become increasingly ineffective and require longer deposition periods to uniformly sputter the larger targets and coat the larger substrates.

In one method of accommodating larger targets, the racetrack magnetron 24 of FIG. 2 is replicated up to nine time in the transverse direction along the scanning direction to cover a substantial portion of the target. See U.S. Pat. No. 5,458,759 to Hosokawa et al. Scanning is still desired to average out the magnetic field distribution. However, there are several disadvantages to this replication approach. First, the separated magnetrons are not believed to optimally utilize the magnetic fields of the constituent magnets. That is, the effective magnetic field is less than is possible. Secondly, a significant number of particles have been observed to be produced during striking of the plasma at the portions of the magnetron near to the plasma dark space shields, which are adjacent to the arc portions 34 of the outer pole 28 of the racetrack magnetron 24. It is believed that electrons leak from the plasma to the nearby shield. Striking voltages of about 800 VDC are required. Such high voltages are believed to disadvantageously produce excessive particles. Thirdly, the prior art using one racetrack magnetron 24 of FIG. 2 reciprocally scans the magnetron at a relatively high speed over a large fraction of the target size to perform approximately 30 to 40 scans during a typical one minute sputter deposition period. Such high scanning rates require a difficult mechanical design for the much heavier magnetrons covering a substantial fraction of the larger target. Fourthly, scanning magnetrons including one or more racetrack magnetrons do not completely solve the uniformity problem. The lateral edge portions of the target 16 underlying the ends of the racetrack magnetron 24 receive a high time-integrated magnetic flux because the arc portions 34 extend in large part along the scan direction. Also, the axial edge portions of the target underlying the magnetron when the scan direction reverses also receive a high time-integrated magnetic flux because of the finite time need to reverse directions. Thus, the target edges are disproportionately eroded, reducing the target utilization and target lifetime, as well as contributing to non-uniform deposition.

SUMMARY OF THE INVENTION

One aspect of the invention includes a magnetron having a convolute plasma loop, particularly one having a generally rectangular outline. The loop may be arranged in a serpentine shape having parallel straight portions connected by curved portions or in a rectangularized helical shape having straight portions arranged along orthogonal directions. The plasma loop may be formed between an inner magnetic pole of one magnetic polarity formed in a convolute shape surrounded by an outer pole of the opposed magnetic polarity. Preferably, the inner magnetic pole has a simple folded shape describable as extending along a single path with two ends. The uniformity of the sputter erosion is increased if one or two external ends of the plasma loop are extended in tails extending outwardly of the useful rectangular outline.

The loop may be twisted a large number of times, for example, greater than 2, 4, or 6 wraps about a center. The rectangularized spiral loop may be formed by a folded plasma loop which is wrapped around the center.

The convolute shape follows a path preferably having straight portions constituting at least 50% and preferably more than 75% of the total path length.

The plasma loop follows a folded track bracketed by the two poles with parallel portions separated by a pitch of between 50 to 125 mm, 75 mm having been established to provide superior results. The scan should be over a distance greater than the pitch, for example, at least 10 mm greater.

The magnetron is only somewhat smaller than the target being scanned, and the target may be relatively large in correspondence to a rectangular flat panel substrate with a minimum dimension of at least 1.8 m. The magnetron may have effective fields extending within an area having sides that are at least 80% and even more than 90% of the corresponding dimensions of the target.

Another aspect of the invention includes scanning a magnetron along two dimensions of a rectangularly shaped target. It is possible to scan along a single diagonal of the rectangular target. It is, however, preferable, that the two dimensions of scanning not be fixed together. The scan speed can be relatively low, for example 0.5 to 5 mm/s with corresponding scan periods of between 20 to 200 s. A single scan period may be sufficient for a panel.

A preferred scan pattern is a double-Z including a continuous scan along two opposed sides of a rectangle aligned with the lateral sides of the target and along the two diagonals connecting the ends of the rectangle sides. The target power may be turned off or reduced on the scan along the sides or may be left on if the magnetron is sufficiently spaced from the frame at the edge of the target. The double-Z scan may be repeated with small displacements between the scans, preferably in a direction perpendicular to the two lateral sides, and more preferably with displacements between adjacent scans being in one and then the other perpendicular directions. The displacement offsets may be in a range of 5 to 15 mm, preferably 8 to 12 mm.

Diagonal and other scans oblique to the Cartesian coordinates of the target are preferably achieved in a zig-zag pattern along the Cartesian coordinates with each of the rectilinear portions of the zig-zag pattern preferably having a length of between 0.4 to 3 mm and more preferably 0.8 to 1.2 mm.

Yet another aspect of the invention moves the scanned magnetron away from the grounded frame or shield defining the chamber wall before igniting the plasma, preferably by a distance of between 1 and 5 mm.

Magnetic uniformity may be improved by using stronger magnets near the center or by placing one or more magnetic shims between the magnets and yoke near the center to bring the center magnets closer to target that the plasma loop is formed by magnets of different strengths or extends over shimmed and unshimmed portions of the magnetron plate.

The magnets may be magnetically held by a magnetic magnetron plate acting as a yoke and laterally aligned by opposed non-magnetic retainers screwed to the magnetron plate. The retainers may be divided into straight retainers arranged in perpendicular sets and connected by curved. The retainers may include serrated inner edges to align one row or two staggered rows of cylindrical magnets therebetween.

The magnetron may be at least partially supported and scanned by an overhead mechanism sliding at perpendicularly arranged opposed pairs of rails with separate actuators for the two perpendicular directions. Two actuators are sufficient but additional actuators allow only pushing action. Alternatively, the magnetron may be at least partially supported on the target assembly through sliders or rollers and pushed along the surface of the target assembly.

DETAILED DESCRIPTION OF THE PREFERRED EMBODIMENTS

Figure 2:
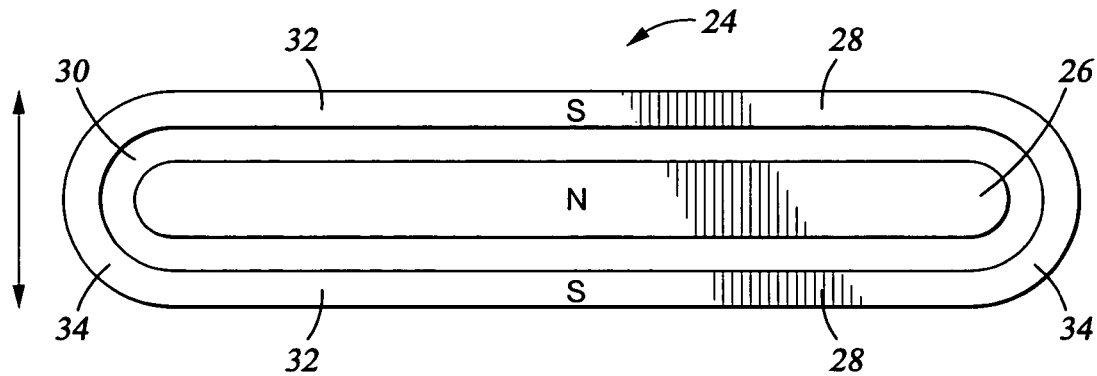
FIG. 2 is a plan view of a convention linear, racetrack magnetron usable with the sputter reactor of FIG. 1.
Figure 3:
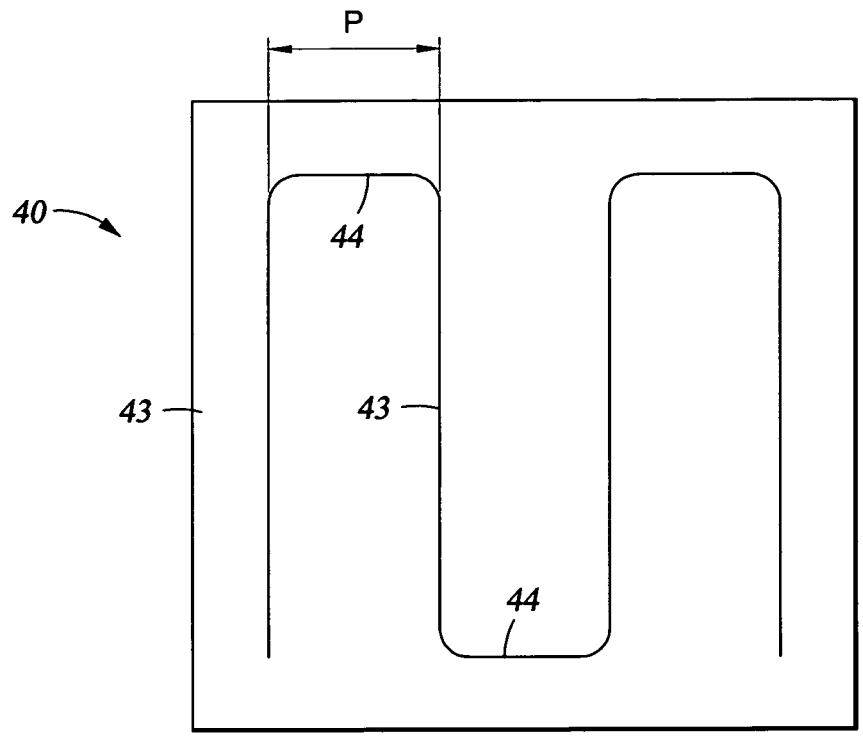
FIG. 3 is a schematic plan view of a serpentine magnetron according to one aspect of the invention.

One aspect of the invention includes shapes for the magnetron that are more convoluted than the linear racetrack of FIG. 2. By convolute is meant a magnetron forming a closed plasma track including curved sections extending in sum over greater than 360° of arc and preferably greater than 720°. In another definition, the linear racetrack magnetron is twisted, for example, into a folded or spiral shape, while it maintains a nearly constant separation of the portions of the gap guiding parallel plasma tracks. In one embodiment illustrated schematically in the plan view of FIG. 3, a serpentine magnetron 40 formed in a magnetron plate 42 includes multiple long parallel straight portions 43 arranged on a pitch P smoothly joined by end portions 44, which may be arc shaped or alternatively short straight portions with curved corners connecting to the straight portions 43. The serpentine magnetron 40 is folded in parallel sections from one lateral side to the other while having substantially shorter sections adjacent the two sides perpendicular to the lateral sides. Since the magnetrons described herein are generally shaped to form a closed plasma loop, the illustrated pitch P will be called the loop pitch to distinguish it from a track pitch to be described later. The effective area of the serpentine magnetron 40 defined by the outer generally rectangular outline of the magnetic field distribution parallel to the target face is a substantial fraction of the target area. The serpentine magnetron 40 may be scanned transversely to the long straight portions 43 across a distance closely related to and of the order of the pitch P in order to completely scan the target area and more uniformly sputter material from that area of the target.

Figure 4:
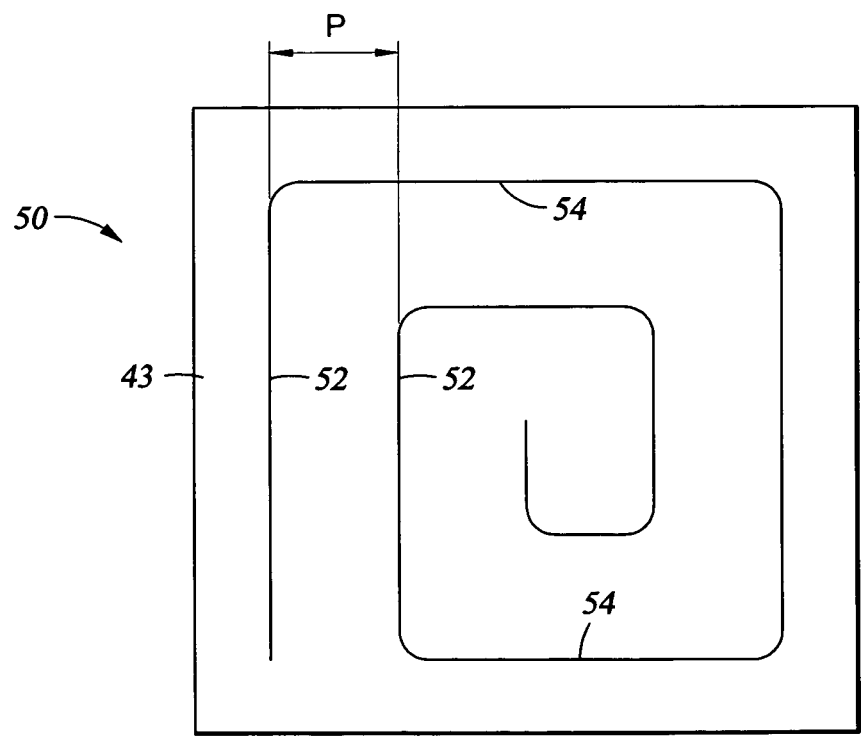
FIG. 4 is a schematic plan view of a rectangularized spiral magnetron of the invention.

In a related embodiment illustrated schematically in the plan view of FIG. 4, a spiral magnetron 50 includes a continuous series of straight portions 52, 54 extending along perpendicular axes and smoothly joined together in a rectangular spiral. Neighboring parallel straight portions 52 or 54 are separated by a loop pitch Q. The spiral magnetron 50 may be considered as a number of wraps about a central point of the magnetron. The spiral magnetron 50 may be scanned in one of the rectangular directions over a track pitch Q, which is half of the loop pitch P, for example along the straight portions 54.

Figure 5:
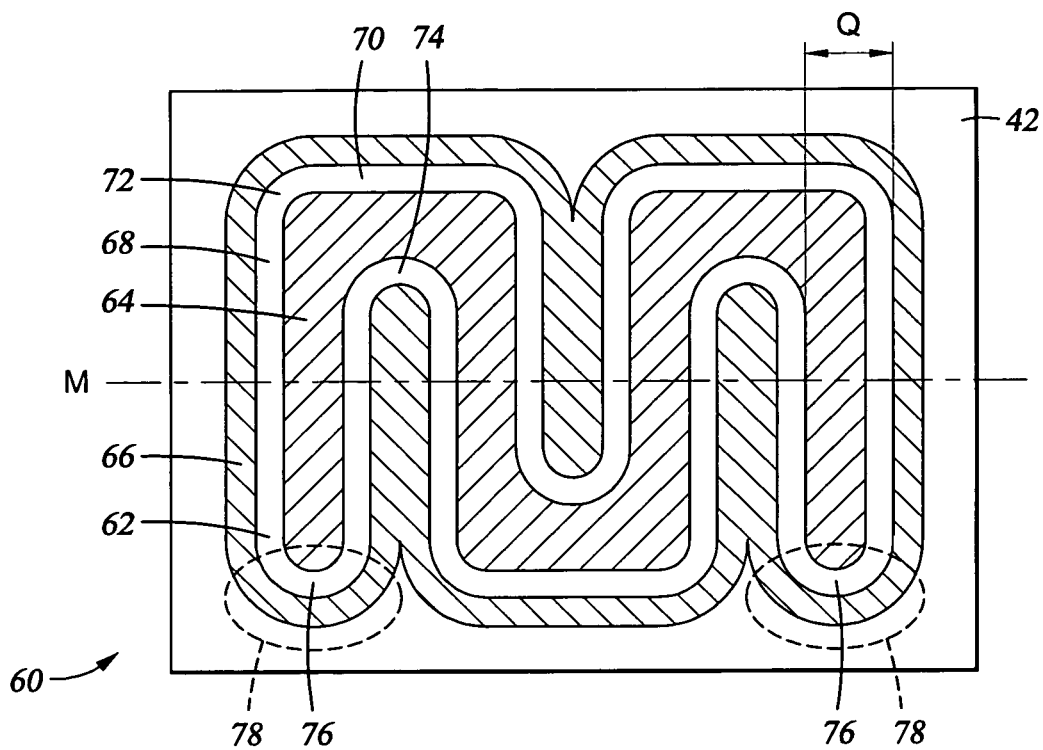
FIG. 5 is a more realistic plan view of a serpentine magnetron.

The magnetron shapes illustrated above are somewhat schematic. The number of folds or wraps in the magnetron 40, 50 may be significantly increased. Although it is not necessary, each of the magnetrons may be considered a folded or spirally wrapped version of an extended racetrack magnetron of FIG. 2 with a plasma loop formed between the inner pole and the surrounding outer pole. When the linear magnetron 24 of FIG. 2 is folded, the poles of neighboring folds may merge. As shown in plan view in FIG. 5, a serpentine magnetron 60 is formed of a closed serpentine gap 62 between an inner pole 64 and an outer pole 66 completely surrounding the inner pole 64. The plasma loop, includes two closely spaced anti-parallel propagating plasma tracks separated by a track pitch Q and folded to form a structure that is generally periodic in the illustrated x-direction with a period of the track pitch Q and having ends generally uniform along the y-direction. The single folded track and hence the magnetron have a shape generally following long straight portions 68 extending symmetrically in one direction about a medial line M and shorter straight portions 70 extending in the other directions. Curved portions 72, 74, 76 connect the straight portions 68, 70. The inner curved portions 74 and end curved portions 76 curve sharply around 180°. The figure illustrates that the outermost portions of the outer pole 66 are thinner than the inner portions indicating the relative magnetic flux density. It is understood that the serpentine magnetron 60 may include additional folds of the plasma loop, particularly for larger target sizes.

Figure 6:
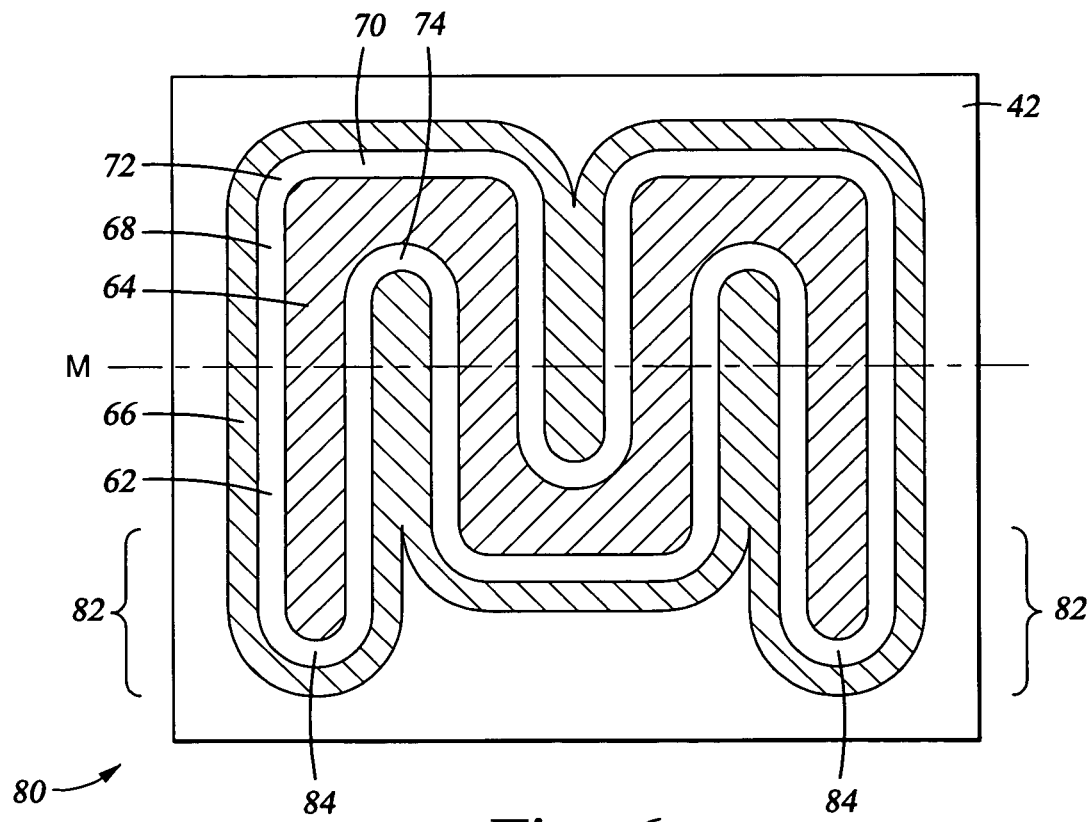
FIG. 6 is a plan view of an improved serpentine magnetron.

However, when such a serpentine magnetron 60 was tested, areas 78 of the target underlying the end curved portions 76 of the magnetron 60 exhibited very low sputtering rates. Rather than increasing the scan length or increasing the entire size of the magnetron, an improved serpentine magnetron 80 illustrated in the plan view of FIG. 6 includes tail portions 82 in which both the inner and outer poles 64, 66 have been extended in the region surrounding end curved portions 84 of the gap 62 so that the end curved portions 84 are outside of a rectangular outline of the useful area of the magnetron 80. As a result, the less eroded regions 78 of FIG. 5 fall outside of the useful target area. The target may need to be enlarged somewhat to accommodate the tail portions 82 but, since little sputtering occurs there, the tail portions 82 may extend closer to the target periphery than the remainder of the magnetron 80 and perhaps may extend over the edge of the target. It is understood that if the plasma loop has an odd number of folds, the two tail portions 82 occur on opposed lateral sides of the magnetron plate 42. A similar tail portion 82 may extend from the single exterior end of the spiral magnetron 50 of FIG. 4.

Figure 7:
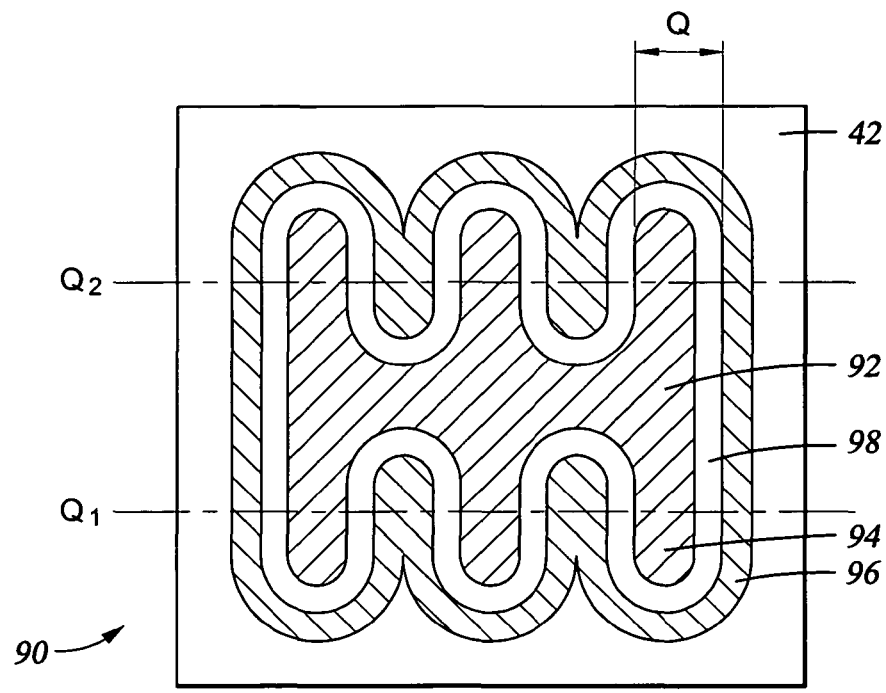
FIG. 7 is a plan view of an alternative embodiment of a serpentine magnetron.

A double-digitated magnetron 90, shown in plan view in FIG. 7 includes an inner pole 92 formed of two opposed rows of generally straight teeth portions 94 and a surrounding outer pole 96 separated from the inner pole by a closed gap 98. The straight portions of the gap 98 are arranged about two general symmetry lines $Q_1$ and $Q_2$. The serpentine magnetrons 60, 80 and double-digitated magnetron 90, although visually different, are topologically similar and provide similar magnetic field distributions. Both advantageously have straight portions constituting at least 50% and preferably more than 75% of the total track length. The digitated magnetron is, however, distinguished from the serpentine magnetron 60 and the spiral magnetron to be described later by its inner pole 92 having a complex shape with many projections and not describable in terms of a single path along which the stretched linear magnetron 24 of FIG. 2 is twisted. In contrast, the inner pole of the serpentine and helical magnetrons has a nearly constant width and follows a single convolute or folded path extending from one end to the other. Expressed differently, the inner pole of serpentine and helical magnetrons has only two ends defining ends of the closed plasma loop while the inner pole of the digitated magnetron has three or more ends with many equivalent ends to the plasma loop. As will be described later, these ends cause some difficulty apparently associated with their tight curvature and it may be advantageous to minimize their number. Hope et al. disclose a single-digitated magnetron in U.S. Pat. No. 4,437,966 and Ribeiro describes a double-digitated magnetron in U.S. Pat. No. 4,826,584.

Figure 8:
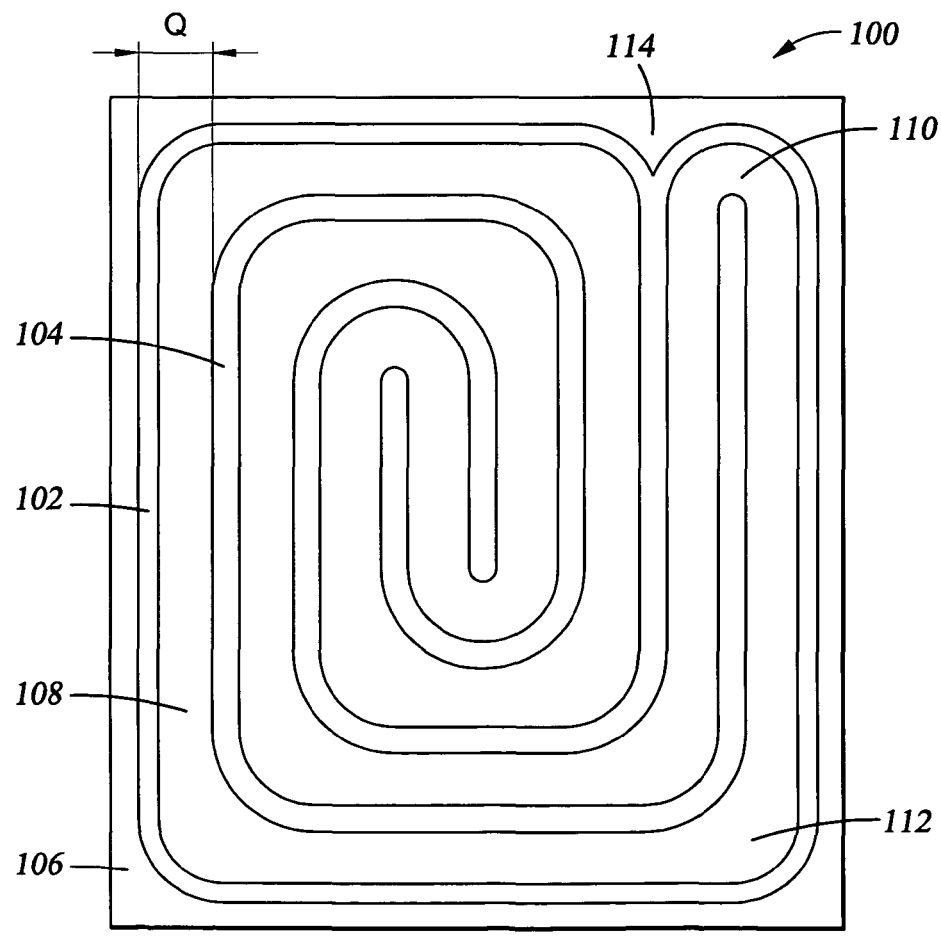
FIG. 8 is a more realistic plan view of a rectangularized spiral magnetron.

A rectangularized spiral magnetron 100 illustrated in plan view in FIG. 8 includes continuous grooves 102, 104 formed in a non-magnetic magnetron plate 106, formed for example out of 6061 aluminum. Unillustrated cylindrical magnets of opposed polarities respectively fill the two grooves 102, 104 to form a plasma track between them. The groove 102 completely surrounds the groove 104. The two grooves 102, 104 are arranged on a track pitch Q and are separated from each other by a mesa 108 of substantially constant width. In the context of the previous descriptions the mesa 108 represents the gap between the opposed poles. The one groove 102 represents the outer pole. The other groove 104 represents the inner pole which is surrounded by the outer pole. Similarly to the racetrack magnetron, whether twisted or not, one magnetic pole represented by the groove 104 is completely surrounded by the other magnetic pole represented by the groove 102, thereby intensifying the magnetic field and forming one or more plasma loops to prevent end loss. The width of the outermost portions of the groove 102 is only slightly more than half the widths of the inner portions of that groove 102 and of all the portions of the other groove 104 since the outermost portions accommodate only a single row of magnets while the other groove portions accommodate two rows in staggered arrangements. The grooves 102, 104 of the magnetron 100 may be modified to include a tail portion around a 180° curved end 110 of the mesa 108, similar to the tail portions 82 of FIG. 6. A single magnetic yoke plate may cover the back of the magnetron plate 106 to magnetically couple all the magnets.

The rectangularized spiral magnetron has grooves 102, 104 and hence poles, when populated by magnets, having straight portions extending along perpendicular directions and joined to each other by curved corners. The straight portions advantageously constitute at least 50% and more advantageously 75% of the total length of the pattern.

The grooves 102, 104 generally represent the two poles defining the plasma track between them. However, the structure is more complex. In this embodiment, the grooves 102, 104 are machined into the non-magnetic magnetron plate 42, for example of aluminum, and include arrays of cylindrical holes or serrated edges to capture the individual cylindrical permanent magnets in a close-packed arrangement. The cylindrical holes within the thicker portions of the grooves 102, 104 may form two linearly extending parallel rows staggered with respect to each other to increase the magnet packing density. The outside portions of the grooves 102, 104 on the other hand may have only one such linear array. Two optional pole pieces typically formed of magnetically soft stainless steel may have the shape and approximate widths of the grooves 102, 104. Screws fasten the optional pole pieces to the bottom of the magnetron plate over grooves 102, 104 to both capture the magnets within the downwardly facing grooves 102, 104 and to act as magnetic pole pieces. However, the magnetic yoke plate may provide sufficient holding force so neither the pole pieces nor screwed fastening means are required, as will be described below with respect to non-magnetic retainers aligning the magnets.

The number of folds of wraps or folds can be significantly increased. Other convolute shapes for the magnetron are possible. For example, serpentine and spiral magnetrons can be combined in different ways. A spiral magnetron may be joined to a serpentine magnetron, both being formed with a single plasma loop. Two spiral magnetrons may be joined together, for example, with opposite twists. Two spiral magnetrons may bracket a serpentine magnetron. Typically, a single plasma loop is desirable. However, multiple convolute plasma loops enjoy some advantages of the invention.

Although the rectangularized spiral magnetron 100 has been found to be effective, its uniformity could be improved. There are several problems. There are cold spots, that is, regions of low deposition rate associated with the curved corners 112 of the gap 108 and a terminal region adjacent the curved exterior end 110 of the plasma track as well as an indented area 114 near the exterior end of the spiral plasma loop that has reduced magnetic field. Furthermore, a central generally rectangular area has been observed to produce reduced deposition relative to the larger outside area. Several improvements over the magnetron 100 are possible.

Figure 9:
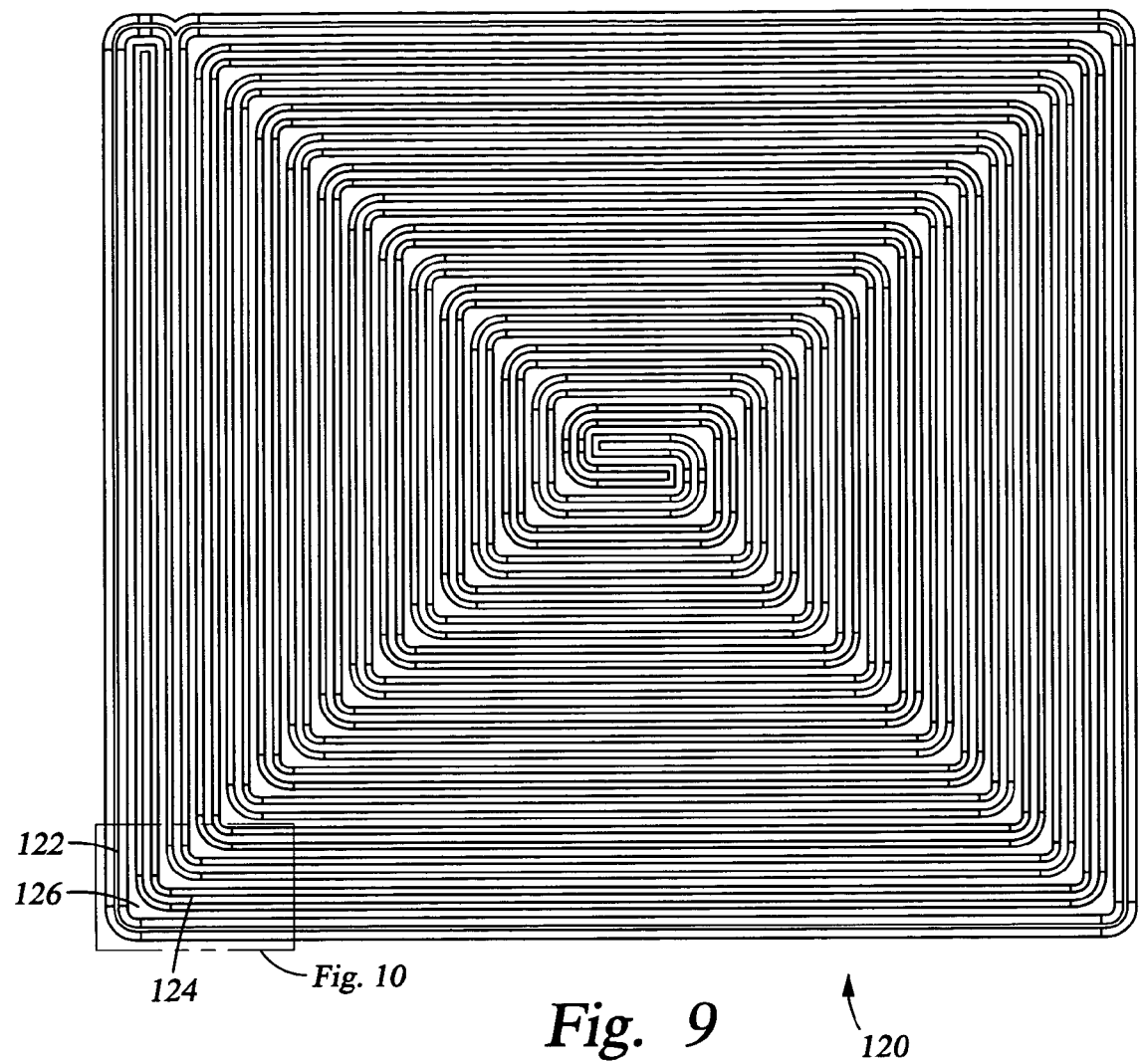
FIG. 9 is a plan view of a spiral magnetron having a large number of wraps and incorporating retainers.
Figure 10:
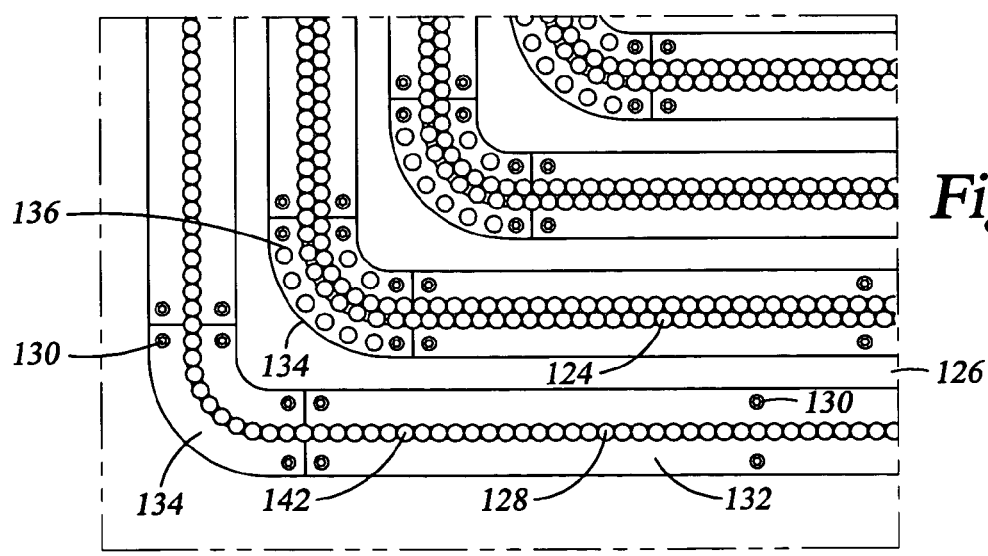
FIG. 10 is an enlarged plan view of a corner of the magnetron of FIG. 9.

A single-spiral magnetron 120, illustrated in a plan view of FIG. 9 with an exploded plan view of a corner in FIG. 10, includes an outer pole 122 of one magnetic polarity surrounding an inner pole 124 of the other polarity with a nearly constant width gap 126 between them. The illustrated structure may be implemented as a convolute retainer structure of pairs of retainers, to be shortly described, to align the magnets between them and having magnet holes or positions 128 for accommodating cylindrical magnets in either of two vertical magnetic polarities along the hole axes. The opposed magnets represent the two opposed magnetic poles. Through holes 130 are drilled in the retainers to accept screws for fastening opposed pairs of straight retainers 132 and curved retainers 134 to a magnetic plate acting as a magnetic yoke. The retainer structure can accommodate about 6000 magnets in the outer and inner poles 122, 124 and create a convolute plasma track having a length of over 75 m. However, not all the holes or positions need to be filled.

To first order, the magnets are arranged on the interior portions in pairs along the convolute path and in single line on the exterior portion of the outer pole 122. Thereby, each plasma track corresponding to the gap 126 is bracketed between two lines of opposed magnets of substantially equal number of magnets dedicated to that track. However, the corners of the rectangularized track are formed by the separate curved retainers 134. At least interior ones of the curved retainers 134 are formed not only with the normal component of single arc-shaped lines of magnet holes but also with extra arc-shaped line of holes 136 away from the gap 126 to accommodate extra magnets. These extra magnets are intended to compensate for the reduced deposition otherwise believed to occur at the 90° corners. These extra magnet positions are filled with magnets of the same polarity for that pole as required to achieve uniform deposition.

The overall structure forms a rectangularized spiral plasma loop having about 6-¾ wraps, that is, significantly more than the less than two wraps of FIG. 8. Each wrap corresponds to two plasma tracks. The two dimensional scanning needs is preferably performed over a length approximately at least as long the separation of two plasma tracks or multiples thereof. The increased number of wraps means that the scanning length can be reduced.

Figure 11:
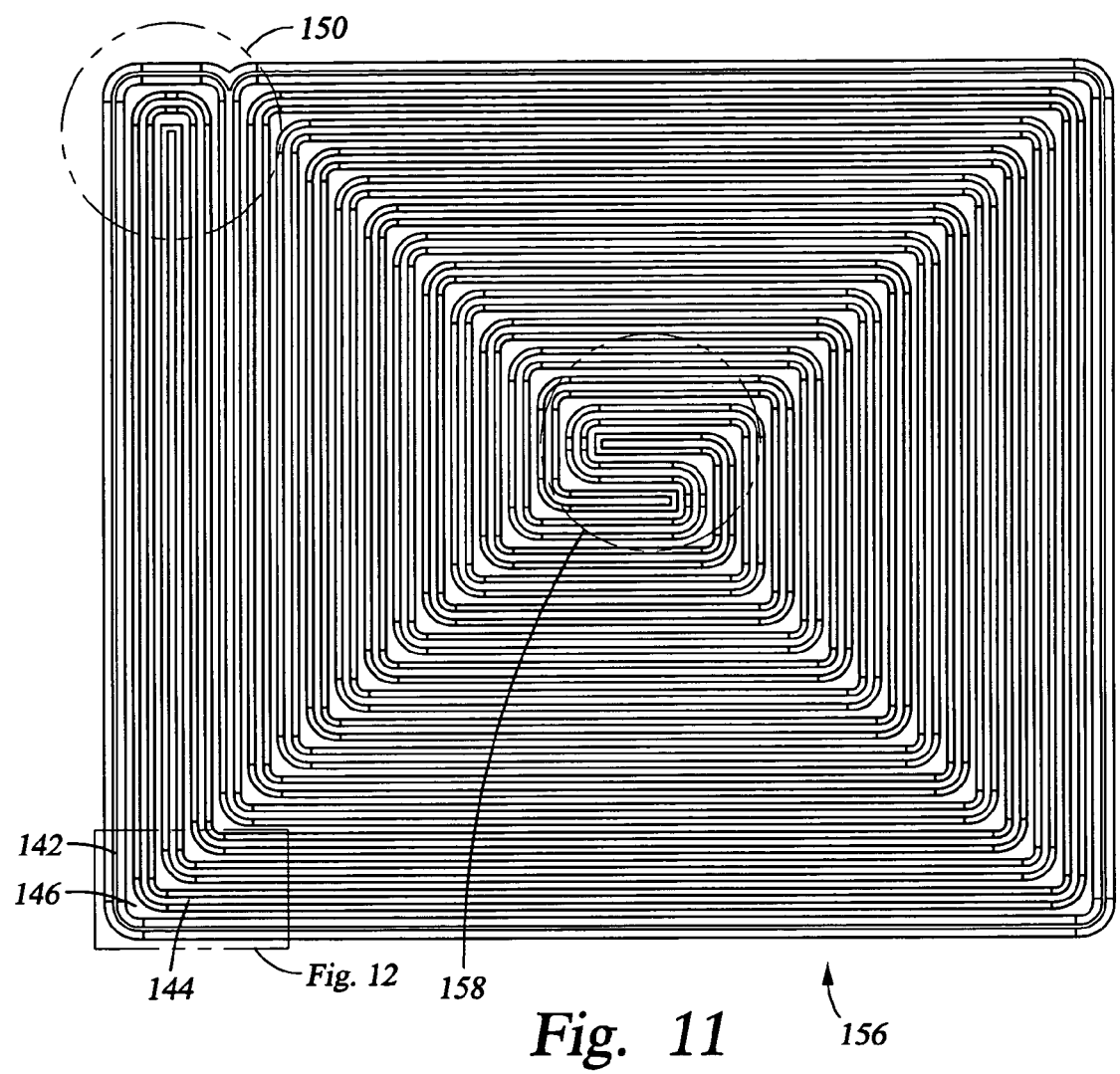
FIG. 11 is a plan view of a double-wrapped spiral magnetron.
Figure 12:
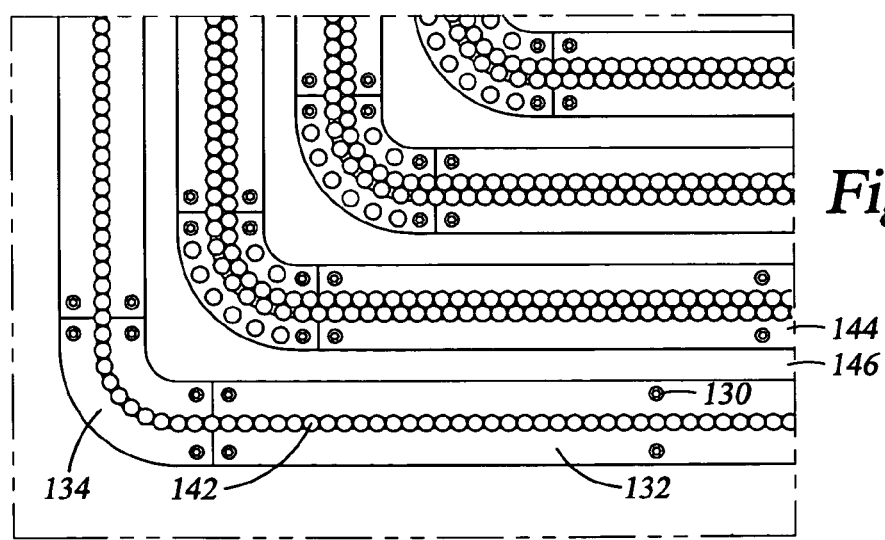
FIG. 12 is an enlarged plan view of a corner of the magnetron of FIG. 11.

A double-spiral magnetron 140, illustrated in the plan view of FIG. 11 and an exploded plan view of a corner in FIG. 12, includes an outer pole 142 surrounding an inner pole 144 and separated by a nearly constant width gap 146. Again, the illustrated structure may represent pairs of retainers 132, 134 screwed to a magnetic base plate and retaining a large number of magnets them where the locus of the magnets represent the poles. This figure does not show the magnets mounted in the double-serrated structure of the retainers and this embodiment does not illustrate the extra corner magnet position. However, the wrapping of the spiral is performed differently is this embodiment. First an elongated version of the linear plasma-loop magnetron 24 of FIG. 2 is folded so that its two ends 34 are laterally adjacent each other and the axial middle of the poles 26, 28 and gap 30 are bent in a wide-radius semi-circular end. In the arrangement of FIG. 11, the rectangularized spiral includes an exterior end 150 having four adjacent and generally parallel plasma tracks and an interior end 152 having two separate ends for the doubled plasma track. The structure has large straight portions with four parallel gaps 146 producing four parallel plasma tracks. This 4-track structure is then wrapped in the illustrated rectangularized spiral having about 30 plasma tracks about the center. It is noted that the wrapping is performed with the wide-radius end of the folded linear magnetron of FIG. 2 is on the outside while the two short-radius ends 30 are in the inside. It is possible to do the wrapping in the other way but the center becomes less symmetrical.

Figure 13:
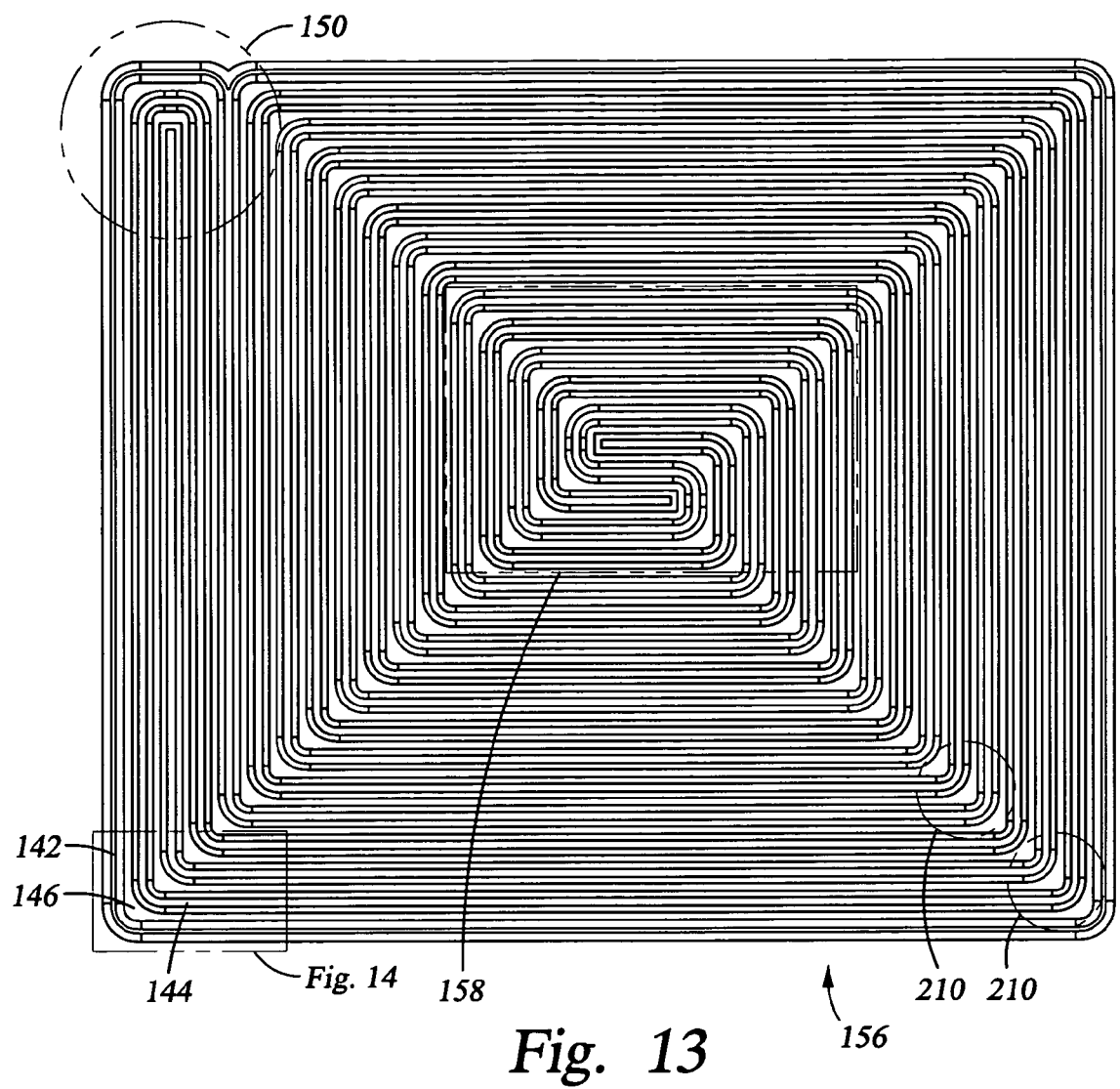
FIG. 13 is a plan view of a spiral magnetron illustrating areas of reduced deposition.
Figure 14:
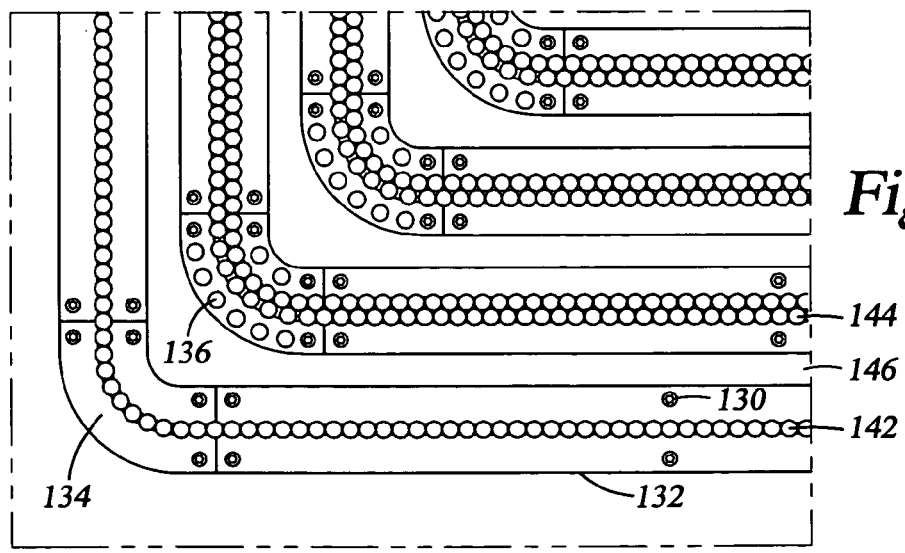
FIG. 14 is an enlarged plan view of a corner of the magnetron of FIG. 13 including extra magnet holes.

Both magnetrons 120, 150 are still subject to light deposition near the center of the magnetron, for example, in a magnetron 156, illustrated in plan view in FIG. 13 and in an exploded plan view of a corner in FIG. 14, includes a generally rectangular interior area 158 occupying about 10% of the total magnetron area subject to reduced sputter deposition rate. The differential deposition can be reduced by using stronger cylindrical magnets within the light-deposition interior area 158 than the magnets used outside the area 158. The overall deposition rate is satisfactory when cylindrical magnets, for example, rare-earth magnets of NdBFe have a magnetic strength of 38 MgO, where MgO stands for mega gauss oersted. Stronger magnets are commercially available with a magnetic strength of 48 MgO, that is, 26% stronger. Any yet stronger magnets are available only in limited quantities and at much higher cost. When the main tracks of the magnetron 156 are populated with 38 MgO magnets outside the light-deposition interior area 158 and with 48 MgO magnets inside the interior area 158, deposition uniformity was significantly improved but was not perfect.

Figure 15:
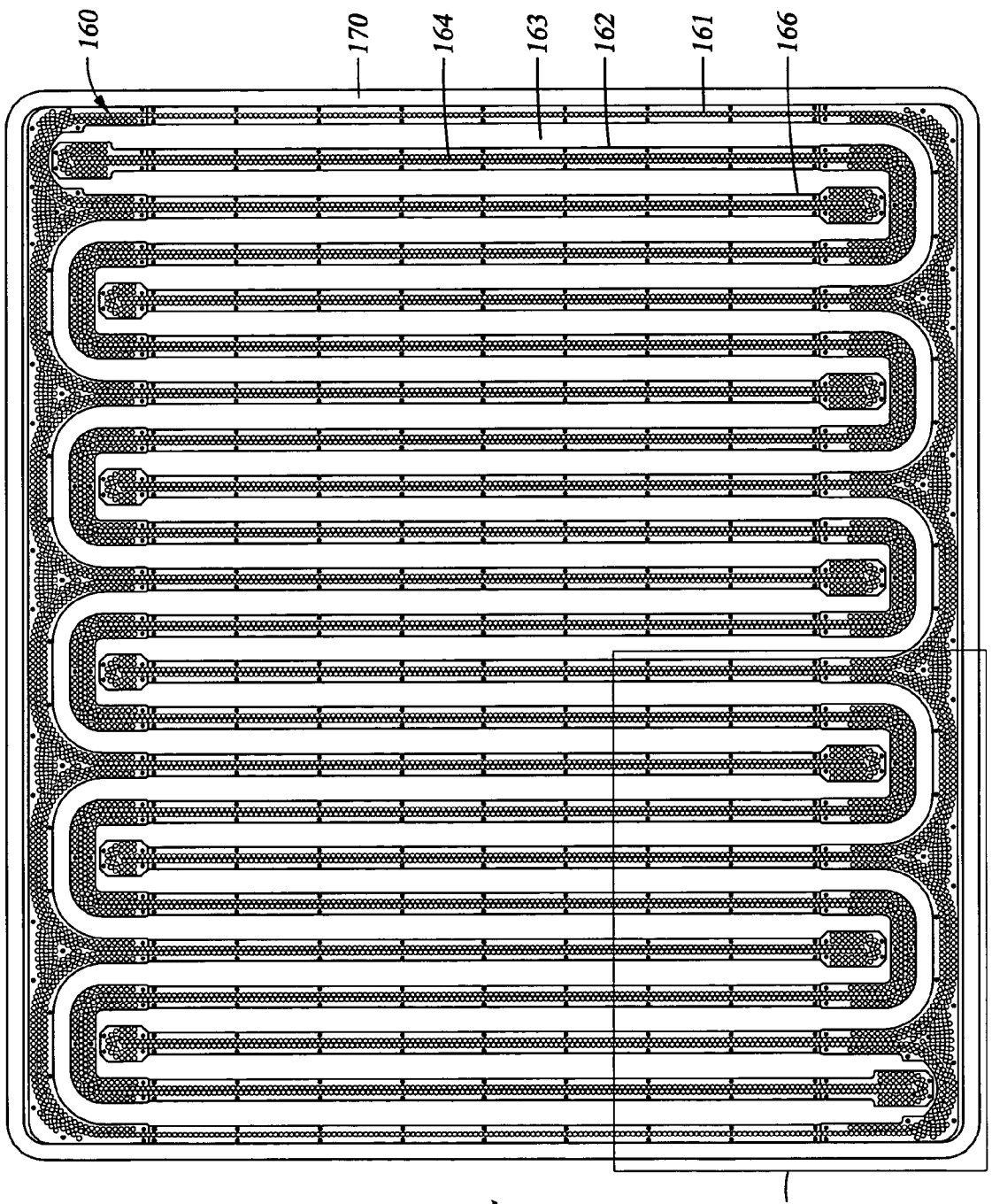
FIG. 15 is a plan view of a large serpentine magnetron.
Figure 16:
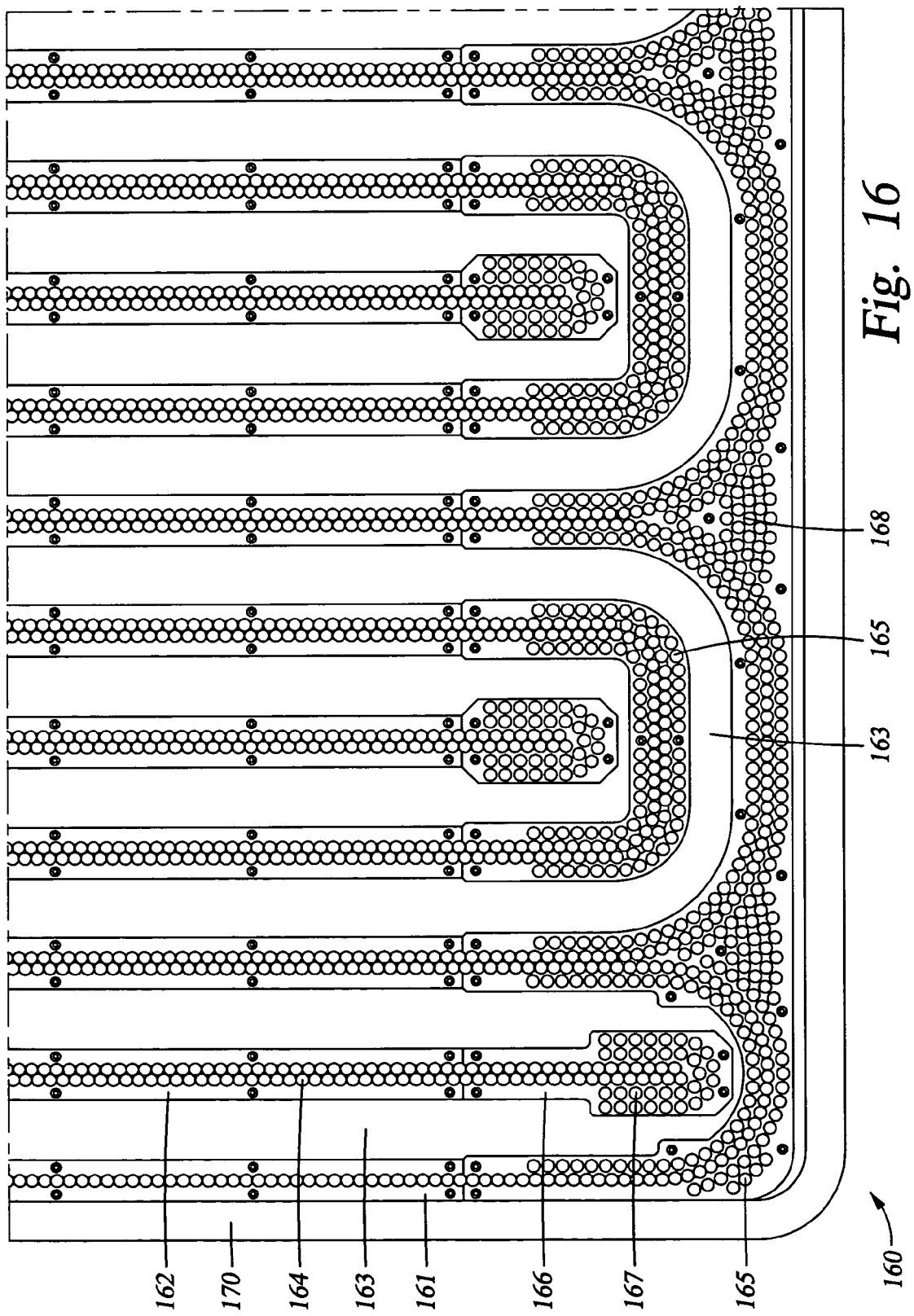
FIG. 16 is an enlarged plan view of a corner of the magnetron of FIG. 14 including extra magnet holes at various locations.

A serpentine magnetron 160, illustrated in the plan view of FIG. 15 and the exploded plan view of FIG. 16, includes ten folds of the linear racetrack magnetron. Its retainer structure is more regular than that for the spiral magnetrons. Outer retainers 161 and inner retainers 162 are separated by a gap 163 generally associated with the plasma track and include a regular generally linear array of magnet positions 164 arranged in double rows in the interior and single rows on the two lateral edges as illustrated. The retainers 161, 162 also include large number of extra magnet positions 165 incorporated into bent retainers at the long 180° bends of the gap 163 on both sides of the 180° bends. The ends of stub retainers 166 associated with the outer magnetic pole includes extra magnet positions 167 at the sharp 180° bends of the gap 163. Further extra magnet positions 168 occur between the long 180° bends adjacent the two exterior top and bottom edges of the magnetron 160 as illustrated.

Figure 17:
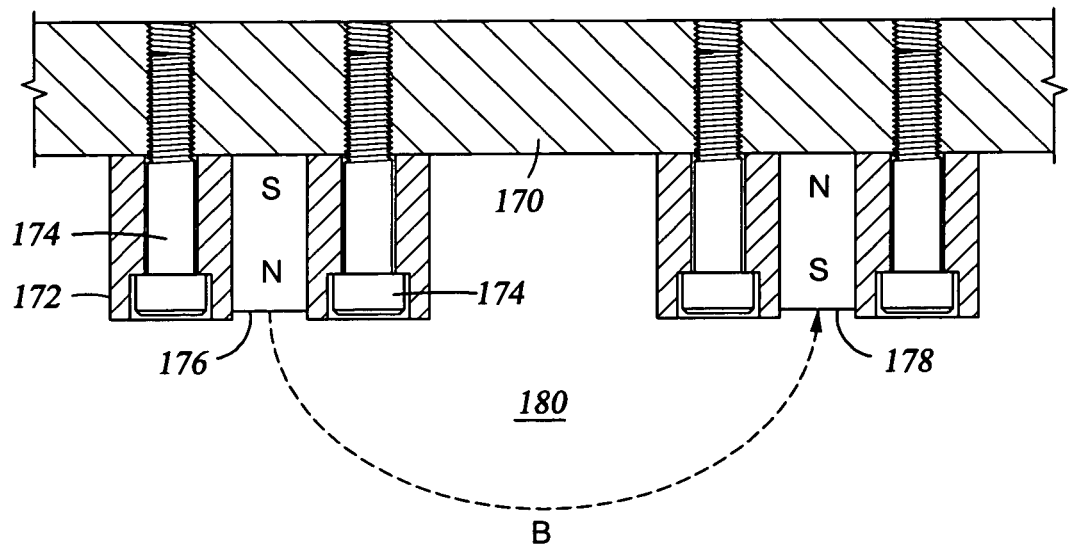
FIG. 17 is a cross-sectional view of a retainer used to capture cylindrical magnets.

An alternative approach to increasing the central deposition rate, particularly in the spiral magnetrons, other than varying the strength of the magnets in the central area 158 requires some understanding of the vertical structure of the magnetron. As illustrated in the cross-sectional view of FIG. 17, a magnetic magnetron or back plate 170 acts as the main support member for the movable magnetron as well as a magnetic yoke. It is a thick plate, for example, ½" (12 mm) thick, formed of a soft magnetic material, that is, magnetizable, such as steel, e.g., cold rolled steel A36 or stainless steel. Non-magnetic retainers 172 are affixed to the bottom of the back plate 170 in its operational orientation by non-magnetic screws 174. The retainers 172 may be composed of aluminum (e.g. 6061 Al) or non-magnetic stainless steel or brass. Cylindrical magnets 176, 178 of opposed magnetic polarities are loosely fit between two retainers 172 with a gap 180 between them and are held to the magnetic back plate 170 by their strong magnetic force. The magnets 176, 178 held between the parallel retainers 172 have opposite polarities and produce a magnetic field B across a gap 180 between the magnets 176, 178. It is not necessary that the retainers 172, 174 be as thick as the length of the magnets 176, 178 they retain. A magnetic pole piece may be affixed on top of the magnets 176, 178 but is not required. If the adjacent magnets 176, 178 have opposed polarities as illustrated, the back plate 170 acts as a magnetic yoke and the opposed magnets 176, 178 produce the magnetic field B between them. The gap 180 between the opposed poles should be considered the distance between the magnets 176, 178 of opposed polarities in different lines since the non-magnetic retainers 172 do not interfere with the magnetic field. The retainers 172 have the advantage that they are typically of lighter material than the magnetic yoke 170 and can be individually designed and installed.

Figure 18:
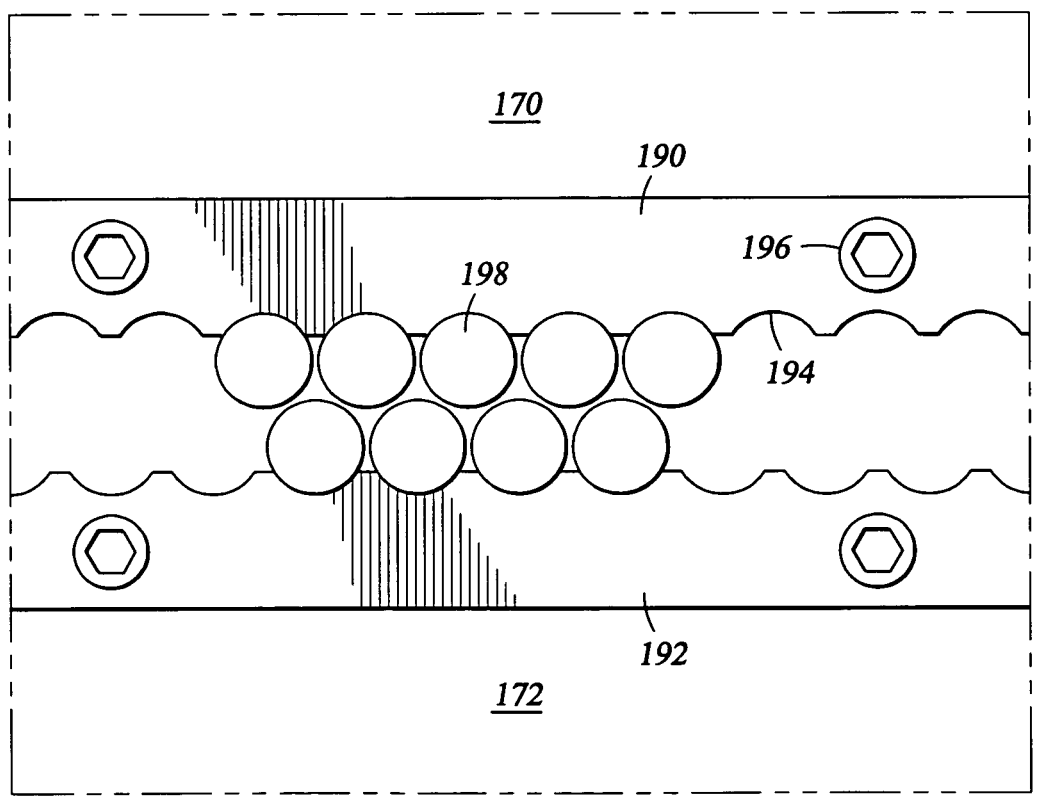
FIG. 18 is a plan view of retainers screwed to a magnetic back plate and capturing magnets forming a magnetron.

The largest portion of the magnetrons 120, 140, 156, 160 includes two adjacent staggered rows of magnets. As illustrated in the plan view of FIG. 18, two straight retainers 190, 192 have facing serrated or scalloped edges with arc-shaped pockets 194 of slightly greater radius than magnets 194 retained by them. Non-magnetic screws 196 hold the retainers 190, 192 to the back plate 170 such that the pockets 194 are axially offset from each other by half a magnet diameter and are spaced to accommodate two close-packed rows of magnets 198.

The exterior portions of the outer pole typically is filled with only a single row of magnets. The straight retainers 190, 192 in these exterior portions can have similar serrated design but are fixed to the back plate 170 with their pockets 194 aligned to each other with space between to capture a single row of magnets 198. The corner sections joining the straight sections include curved portions which bend the single or double row of magnets by 90°. The corner sections may include similar retainers but having curved portions having different radii. The corner sections may be separately fabricated and screwed to the back plate 170 in alignment with the neighboring straight retainers 190, 192.

Figure 19:
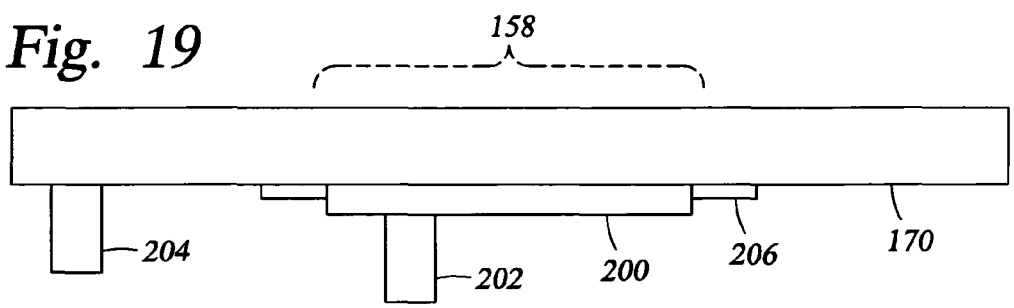
FIG. 19 is a cross-sectional view of a magnetron incorporating shims to improve deposition uniformity.

Another method of increasing the center deposition, as illustrated in the cross-sectional view of FIG. 19, affixes a shim 200 of magnetic material such as the aforementioned cold rolled steel to the side of the back plate 170 facing the target in the central area 158 exhibiting low deposition rate. The shim thickness may be in the range of 2 to 8 mm, for example, 5 mm, to effectively raise the height of that surface. Retainers are screwed to the shim 190 in the central area 158 and directly to the back plate 170 outside the central area 158 so that the height of a magnet 202 held by the retainers is effectively raised in the low-deposition central area 158 bringing them closer to the target relative to magnets 204 held outside the central area 158, thus increasing the magnetic field at the target adjacent the central area 158 and thereby increasing the plasma density and the sputtering rate there. If desired, a transition shim 206 of lesser thickness, for example, 2 mm, may be affixed to the back plate 170 around the periphery of the central shim 200 to and fixing further magnets retainers to the transition shim 206 to ease the transition between the magnets 202, 204 held at different heights and to provide improved deposition uniformity. Alternatively, the transition shim 206 may underlie the main shim 200 but extend laterally beyond it. Additional peripheral shims may be used or a shim of tailored profile may be machined into a shim. It is even possible to machine a profile into the back plate 170. However, flexibility is enhanced by use of one or more shims.

Returning to FIG. 13, the magnetrons as previously described emphasize the straight portions parallel to the sides of the rectangular magnetron to increase the uniformity. The straight portions are joined by curved portions or corners 210 disposed approximately on the two diagonals of the rectangular magnetron and illustrated in more detail in FIG. 14. The corners have generally the same fairly small radius. As a result, the width of the gap between opposed magnets increases within the curved portions of the corners 210 with a resulting decrease in the magnetic field projected in the front of the target and also a decrease in sputtering rate. A few or many extra magnets may be placed in the extra holes 136 formed in the curved retainers 134 to compensate for the otherwise reduced magnetic field in the corners 210. It is anticipated that the corners 210 will need tuning not only in the development of the apparatus but also when a machine is applied to different sputtering materials and sputtering conditions. That is, the corners 210 will need much adjustment both in the development lab but also in the field.

Figure 20:
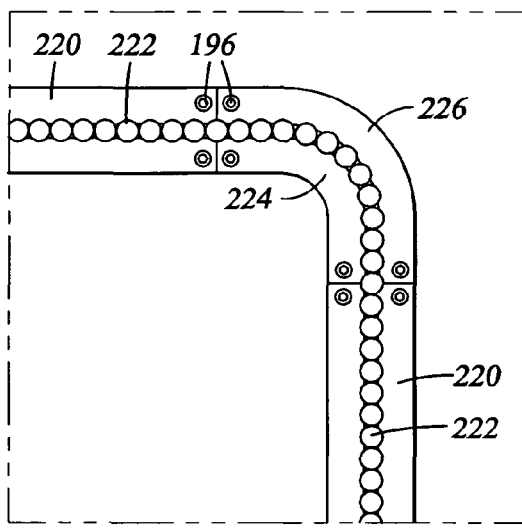
FIGS. 20 through 22 are plan view of interchangeable corner retainers of different radii.
Figure 21:
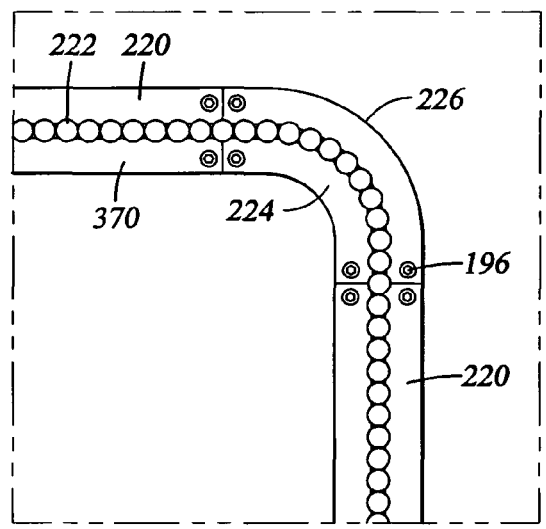
Figure 22:
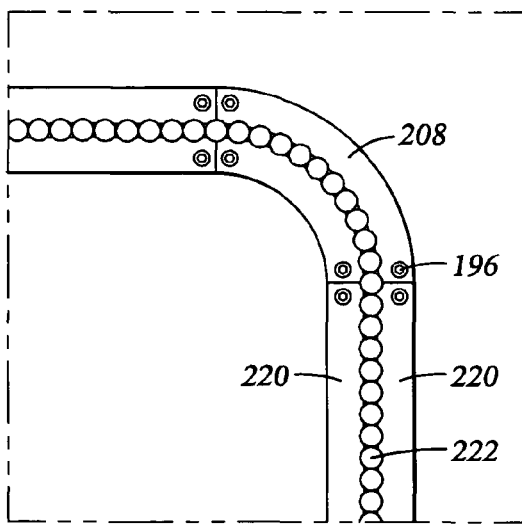

The back plate 170 is a large and very heavy piece. It is desired that, once it has been fabricated and shipped from the machine shop, modifications may be made in the development lab or in the field not only by adjusting the population of magnets but also by designing new retainers and shims which can be more inexpensively machined and more easily shipped and be field installed. For example, FIGS. 20 through 22 show straight retainers 220 with their pockets 222 aligned with each other to accommodate a single row of magnets in the example, but other embodiments may include multiple rows of magnets. The screws 196 fix the straight retainers 220 to predetermined positions on the back plate 170. The straight retainers 220 extending in perpendicular directions are joined by an inner corner retainer 224 and an outer corner retainer 226, again designed to accommodate a single row of magnets. The three sets of corner retainers 224, 226 illustrated in the different drawings of FIGS. 20-22 include curved portions of different radii and straight portions of decreasing extent between the three embodiments. However, their ends are similarly displaced from each other and the screw holes for the screws 196 in both the corner retainers 224, 226 and the back plate 170 are similarly placed in all three embodiments As a result, to adjust the magnetic field distribution at the corners of the magnetron, it is required only to substitute a different set of corner retainers 224, 226 into the existing set of screw holes tapped in the back plate 170.

It is possible to increase the magnetic field strength at the corners by using magnets of greater strength at the corners and magnets of lesser strength in the straight portions.

Figure 23:
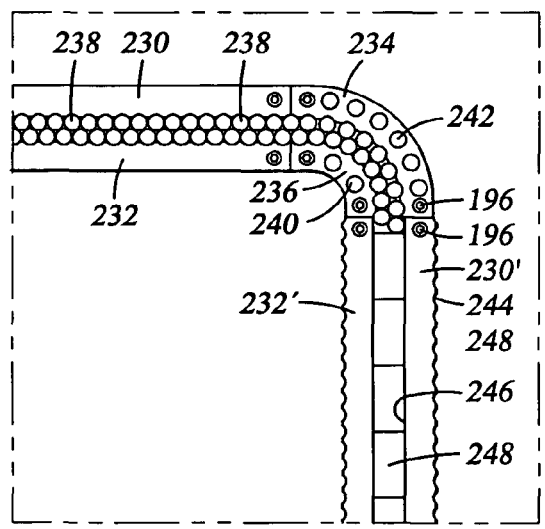
FIG. 23 is a plan view of retainers capturing two rows of cylindrical magnets and alternatively capturing bar magnets.

A two-row corner is illustrated in the plan view of FIG. 23 having two perpendicular sets of straight retainers 230, 232 which are joined at the corner by an outer corner retainer 234 and an inner corner retainer 236. The pockets of the straight retainers 230, 232 are staggered to accommodate two closely packed rows of cylindrical magnets 238, The corner retainers 234, 236 are positioned to also accommodate two curved rows of magnets 238, which are packed as closely as the curvature allows. The corner retainers 234, 236 may be easily replaced by other corner retainers 234, 236 having a different curvature and smaller or larger straight portions.

A further feature is that the corner retainers 234, 236 may also include supplemental magnet holes 240, 242 inside and outside of the double row of magnets 238. As required in optimizing the magnetic field distribution at the corner, supplemental magnets may be placed in one or more of the supplemental magnet holes 240, 242 to increase the magnetic field strength at the corners. Supplemental magnet holes 240, 242 may also be formed in the single-row corner retainers 234, 236 of FIGS. 21 through 22.

A yet further feature is illustrated in FIG. 23. If the positions of the tapped holes for the screws 196 are correctly chosen to satisfy both of the two inverted orientations, a pair of the straight retainers 230, 232 can be flipped about their longitudinal axes to form straight retainers 230', 232' such that their serrated edges 244 face outwardly and flat edges 246 face inwardly to accommodate a series of rectangular or bar magnets 248 polarized vertically to the plane of illustration. The bar magnets 248 potentially provide greater magnetic field strength because of the unity packing factor. Of course, special straight retainers may be designed having only flat edges.

The serpentine magnetrons 60, 80, 160 have one principal set of straight sections 220, 222 connected mostly by 180° curved sections while the rectangularized spiral magnetrons 100, 120, 140, 156 have two sets of parallel straight sections 220, 222, both of which may be considered principal sets, connected mostly by 90° curved sections 204, 206 or 234, 236. All the magnetrons benefit from one-dimensional scanning over the pitch P in a direction transverse to one of the principal sets of straight sections. However, such one-dimensional scanning still suffers some deficiencies. First, uniformity of sputtering greatly suffers because there are substantial portions of the magnetron which extend in directions having components parallel to the scan direction. The effect is most pronounced in the rectangularly spiral magnetrons in which the straight sections extending along the scan direction such that there is a large non-uniformity in the direction transverse to the scan direction. Even in the serpentine magnetrons, a higher magnetic density tends to occur in the areas of the 180° curved sections to cause the lateral edges of the target to be eroded more quickly than the central medial portion of the target. Nonetheless, these magnetrons still erode the central medial portion of the target less than the more lateral portions. Secondly, unless other precautions are taken, all the magnetrons continue to create a plasma adjacent the lateral edges of the target near the plasma shields. As previously explained for the linear racetrack magnetron, the proximity greatly increases the production of particles during plasma ignition. Thirdly, over erosion continues to result from an end dwell when the magnetron is rapidly and reciprocally scanned.

Figure 24:
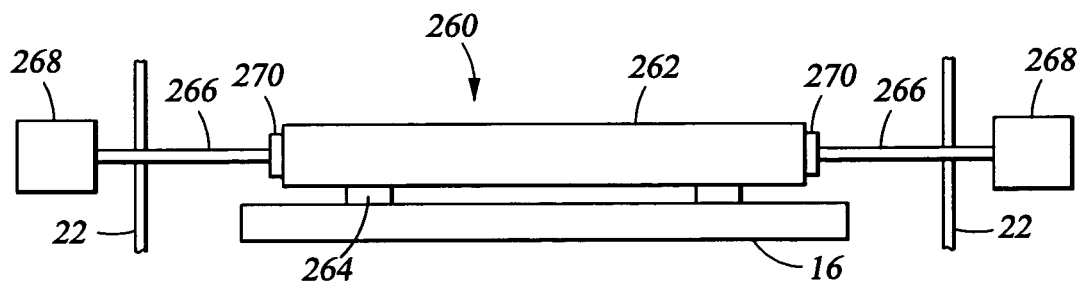
FIG. 24 is an elevational view of a linear scan mechanism having the magnetron slidably supported on the target.

Sputtering uniformity can be increased by scanning a convoluted magnetron in two orthogonal dimensions over a rectangular target. The scanning mechanism can assume different forms depending upon the complexity of the desired scan pattern. In a scanning mechanism 260 illustrated in FIG. 24, the target 16 supports on its back, top side a magnetron plate 262 including the magnets through a plurality of insulating pads 264 or roller bearings held in holes at the bottom of the magnetron plate 262. The pads 264, if they are such, may be composed of Teflon® plastic (a trademarked product of DuPont) or other soft polymeric material and have a diameter of 5 cm and protrude from the magnetron plate 262 by 2 mm. Opposed pusher rods 266 driven by external drive sources 268 penetrate the vacuum sealed back wall 22 to push in opposite directions through couplings 270 against the magnetron plate 262. For two-dimensional scanning, the couplings 270 may be formed of a rotatable wheel selectively and smoothly pushing the magnetron plate 262 although a soft Teflon pad may suffice. The motive sources 268 typically are bi-directional rotary motors driving a drive shaft having a rotary seal to the back wall 22. A lead screw mechanism inside of the back wall 22 converts the rotary motion to linear motion. Alternatively, the lead screw mechanism may be exterior to the sealed back wall 22 and be coupled through the back wall 22 to the pusher rod 266 through a sealed bellows assembly. The two perpendicularly arranged pairs of pusher rods 266 and motive sources 268 provide independent two-dimensional scanning. A single pair of pusher rods 266 and motive sources 268 aligned along the target diagonal provide coupled two-dimensional scanning relative to the sides of the target. Other types of actuators are possible including pneumatic cylinders, stepper motors, and rack-and-pinions, both inside and outside of the low-pressure back chamber.

Figure 25:
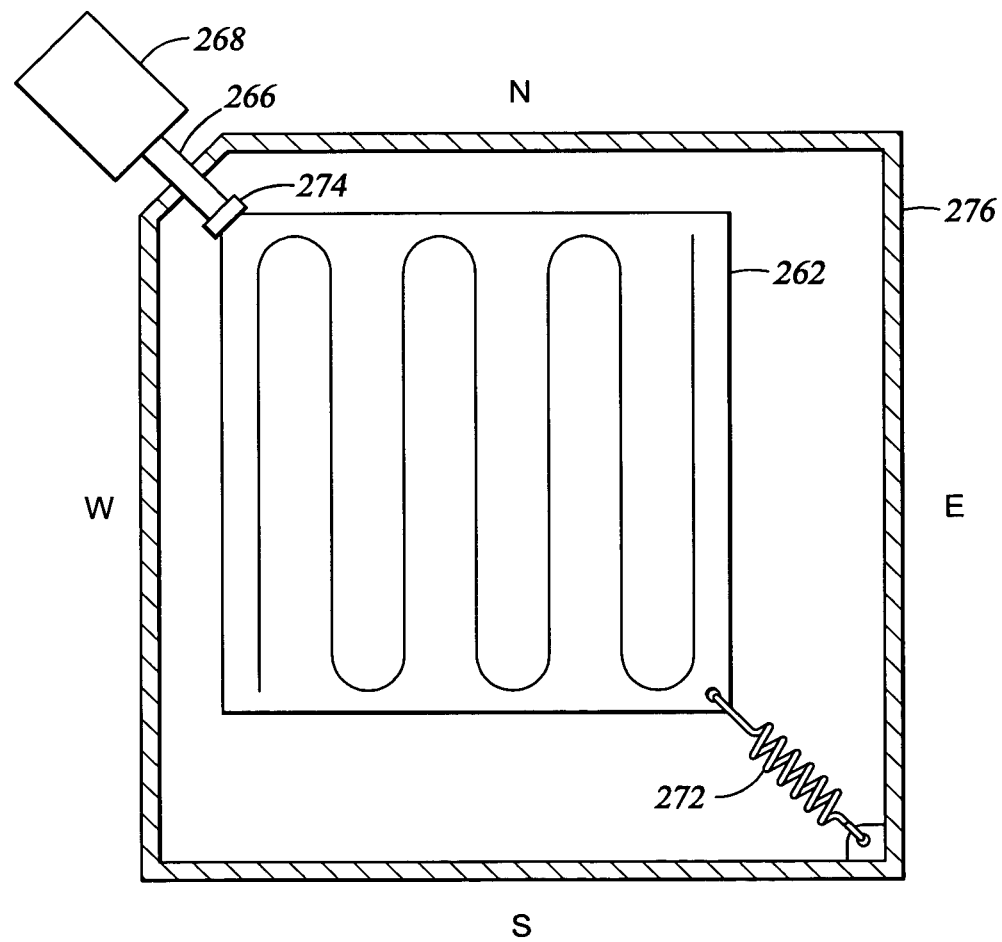
FIG. 25 is plan view of diagonal scan mechanism.

In another embodiment illustrated in the plan view of FIG. 25, a spring 272, preferably a compression spring in the illustrated geometry for a pushing motive force, may replace one of the opposed pusher rods 266. Also, a coupling 274 between the pusher rod 266 and the magnetron plate 262 may be fixed so that one rod 266 can both push and pull the magnetron plate 262 in opposition to the spring 262, now preferably a tension spring To accomplish a diagonal scanning pattern, a convoluted magnetron formed in a magnetron plate 262, as illustrated in plan view in FIG. 25, is supported within a rectangular frame 276 forming part of the back wall 22. Although a serpentine magnetron is illustrated, other magnetron shapes may be substituted. The actuator 268 coupled to the magnetron plate 262 through the fixed coupling 274 drives it along a diagonal of the frame 276, that is, in the northwest to southeast direction which is both parallel to and transverse to the direction of the principal set of straight portions of the magnetron. In the illustrated embodiment, the spring 272 acts in opposition to the actuator 268. As a result of the diagonal scanning, the over erosion on the north and south sides of the target is reduced.

It is possible to extend the scan to a back-and-forth scan along the frame diagonal or along one of its principal axes with the plasma turned on so that the magnetron is returned to its original position ready for sputtering onto the next panel. Alternatively, the back scan can be performed with the plasma turned off while a new panel is being placed in the sputter reactor and the sputter chamber is pumped down and equilibrated. In a further alternative, one panel can be sputter deposited during a forward scan and a second panel is deposited during the subsequent back scan.

Other types of scanning mechanisms are possible. The sliding pads 264 can be replaced by wheels or ball or roller bearings as disclosed by Inagawa et al. in U.S. patent application Ser. No. 11/347,677, filed Feb. 3, 2006 and incorporated herein by reference. Preferably the wheels, ball or rollers are electrically insulating to leave the magnetron plate 262 grounded while being supported on the biased target 16. For simple motions, a guide plate intermediate the magnetron plate 262 and target 16 guides the scanning. As has been described in the aforecited Halsey patent, the magnetron plate 262 may be supported from above by one or more guide plates through wheels and support rods.

The extent of the scan may be relatively limited. It is generally preferred that the scan length be at least the pitch between neighboring plasma tracks, preferably approximately equal to the pitch or a small multiple thereof. For example, for a magnetron having a relatively small number of folds or wraps with a pitch of 75 mm between neighboring anti-parallel tracks and designed for a 2 m target, the scan distance should be at least 75 mm. For magnetrons with a larger number of folds or wraps, such as the magnetrons 120, 140, 156, 160, the scan distance can be decreased. To allow for variable magnet strength and position, it is recommended that the scan distance be at least 10 mm larger than the pitch of the plasma tracks. Scan distances of more than 50% greater than the pitch detract from the advantages of the invention. Experiments have show that scan distances in the range of 85 to 100 mm provide superior erosion. A pitch of 75 mm between magnet grooves and hence between plasma tracks has proven quite effective, indicating a preferred range of 50 to 125 mm for the pitch. An increased number of wraps or folds in the convolute magnetron decreases the required scanning length.

The scanning benefits from two operational characteristics. First, the scanning may be advantageously performed at a relatively low speed of about 1 mm/s so that a complete deposition is performed in a single scan of the frame diagonal or, as will be explained later, in a few such diagonal scans. Very good results have been obtained with a scan speed of 2 mm/s indicating a preferred range of 0.5 to 5 mm/s. For a 100 mm scan, a complete scan can be accomplished in 20 to 200 s. The slow speed simplifies the heavy mechanics. Secondly, it is advantageous to start the slow scan with the plasma extinguished and to strike the plasma after the magnetron has departed from the immediate vicinity of the grounded frame 276, for example, after an initial scan of 2 mm indicating a preferred range of 1 to 5 mm. The delayed striking allows the scan speed to equilibrate. More importantly, however, striking away from the frame 266 significantly reduces the production of particles, which are believed to originate from uncontrolled arcing during the plasma striking.

Figure 26:
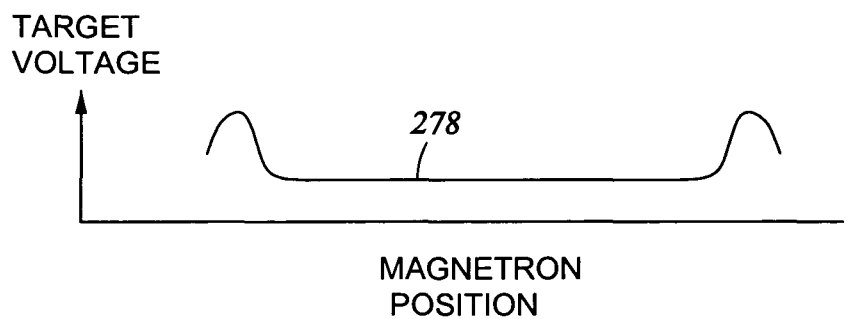
FIG. 26 is a graph showing the variation of target voltage with scan position.

Experiments have been performed in which a linear racetrack magnetron is scanned across the frame with a constant power supply. The target voltage is observed, as indicated by plot 278 in the graph of FIG. 26, to rise from about 500V in the middle to near 600V near the frame 276 or shield, indicating dependence of the plasma impedance upon the magnetron position. This high voltage adjacent the frame is believed to result from electron leakage to the frame 276 and is associated with excessive arcing during striking. If the plasma is instead struck in the flat portion of the curve, arcing is substantially reduced. Advantageously also, the plasma is extinguished before the magnetron reaches the other diagonal corner. As is well known, striking and extinguishing the plasma is primarily effected by respectively raising and lowering the power applied to the sputtering target. If further deposition is to be performed on the same substrate, it is alternatively possible to reduce the target power to achieve a lower-density plasma rather than to completely extinguish the plasma, thereby significantly reducing the generation of particles at the target edge. The same variation of voltage may be applied to a scan perpendicular to the sides of the frame 276 in which the voltage is reduced or the plasma extinguished near the frame 276.

It is also observed that the target voltage with the rectangularized spiral magnetron 100 of FIG. 8 is only about 350V, indicating a very efficient magnetron.

Figure 27:
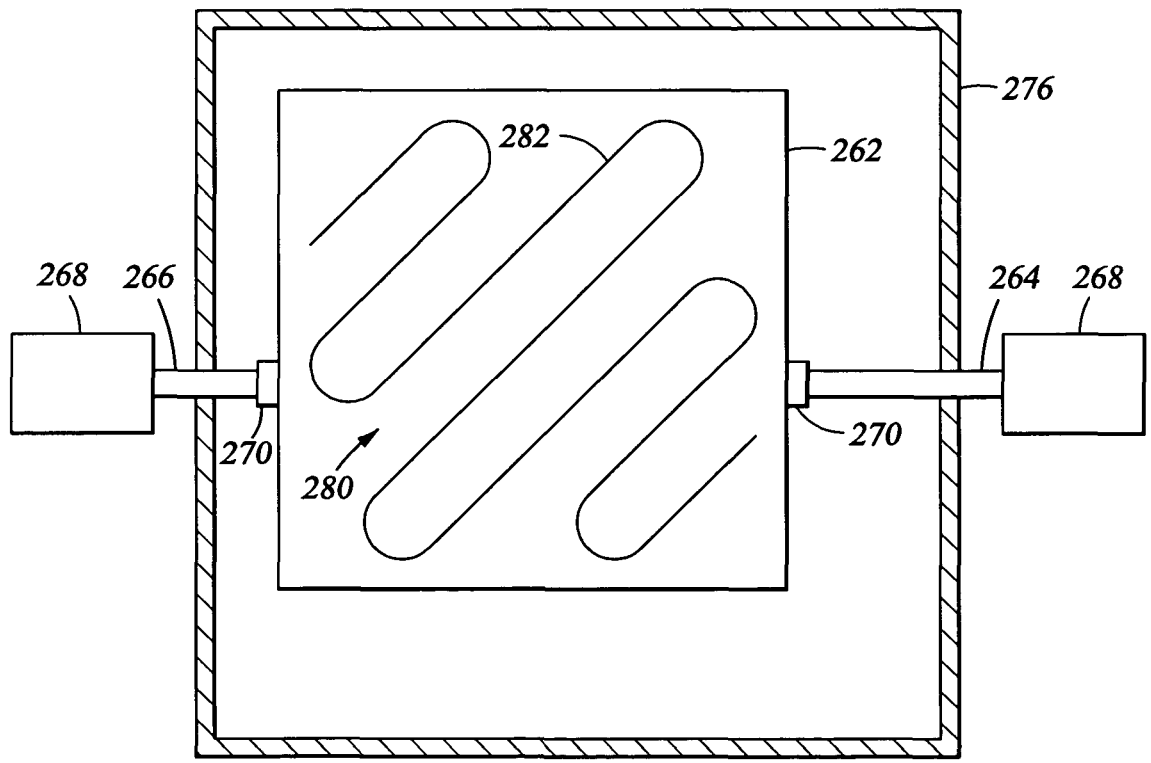
FIG. 27 is plan view of a linear scan mechanism combined with an inclined magnetron achieving some of the results of a diagonal scan.

A somewhat similar effect to the diagonal scan mechanism of FIG. 25 can be obtained, as illustrated in FIG. 27, with a magnetron 280 formed in the magnetron plate 262 with its one or two principal sets of straight sections 282 formed at an inclined angle with respect to the rectangular coordinates of the frame 276, for example, at 45° or parallel to the frame diagonal. The effect of the diagonally arranged magnetron is most apparent from the illustrated serpentine magnetron, but a similar effect can be obtained with a rectangularized spiral magnetron having its straight sections arranged at complementary inclined angles to the sides of the frame and with respect to the single-axis movement. Opposed actuators 268 aligned along one of the two rectangular coordinates scan the magnetron plate 262 along that coordinate. In this embodiment, the scan is one-dimensional but the magnetron shape is distinctly two-dimensional relative to the frame 276. To avoid edge effects upon striking, extra target space should be provided along the lateral sides.

Figure 28:
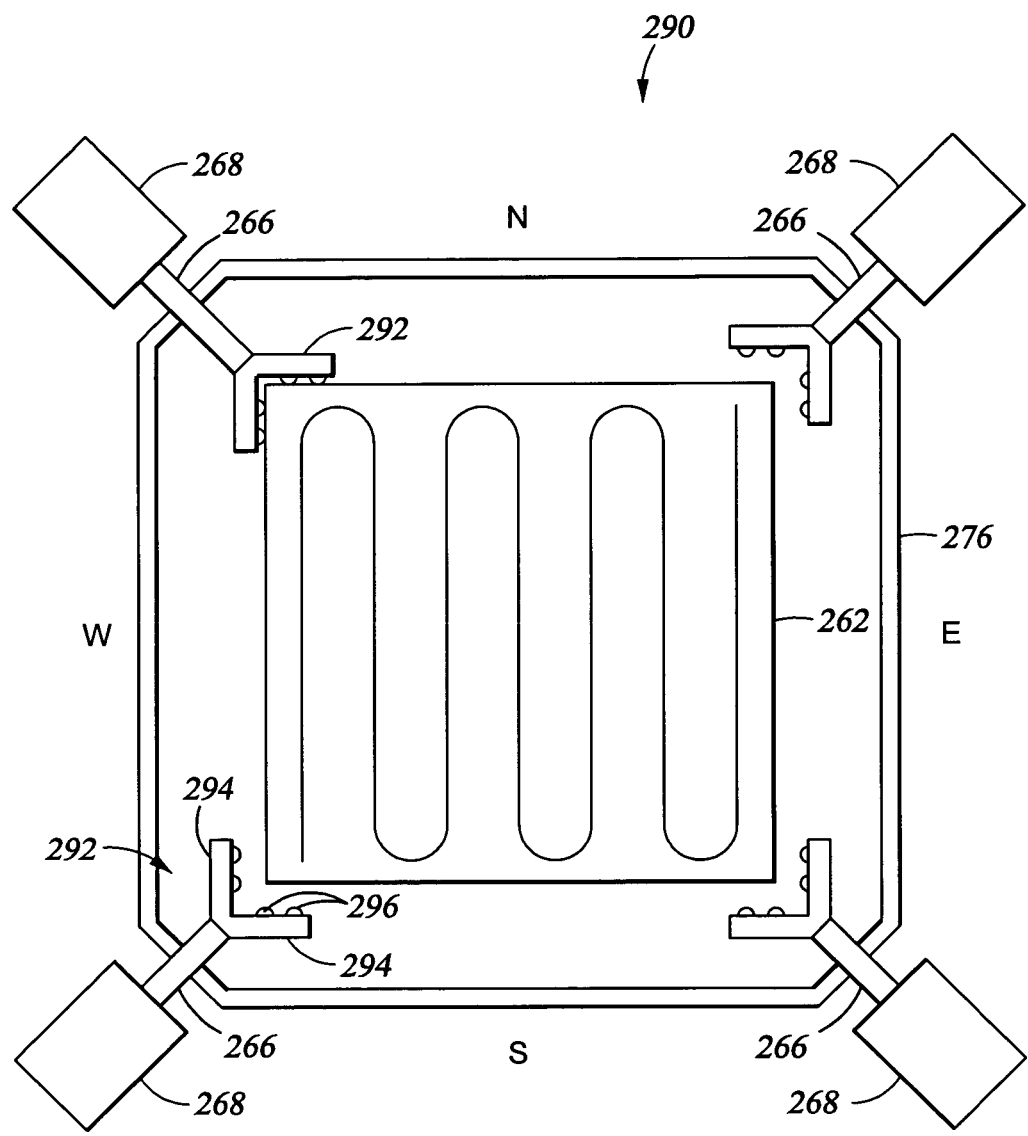
FIG. 28 is a plan view of a first embodiment of a two-dimensional scan mechanism.

Scanning along two diagonals is achievable with a scan mechanism 290 illustrated in schematic plan view in FIG. 28. Four actuators 268 located at the corners of the rectangular frame 276 are aligned in opposed pairs along the two frame diagonals. Each actuator 268 is fixed to one of the corner push rods 266. A corner bracket 292 connected to the end of the push rod 266 includes two perpendicular arms 294, each having a plurality of wheels 296 or other sliding means which can smoothly engage and align the respective corners of the magnetron plate 262 to accurately push it along one of the frame diagonals. Although a serpentine magnetron is illustrated, other convolute magnetron shapes may be used with this and other two-dimensional scanning mechanisms. Scanning along either diagonal requires only varying one of the actuators 268. The scanning can be transferred from one diagonal to the other by pushing the magnetron plate 262 along the first diagonal by one of the actuators 268 aligned with that first diagonal to a central point through which the second diagonal passes. Thereafter, one of the actuators 268 aligned with the second diagonal engages the magnetron plate 262 to push it along the second diagonal.

Figure 29:
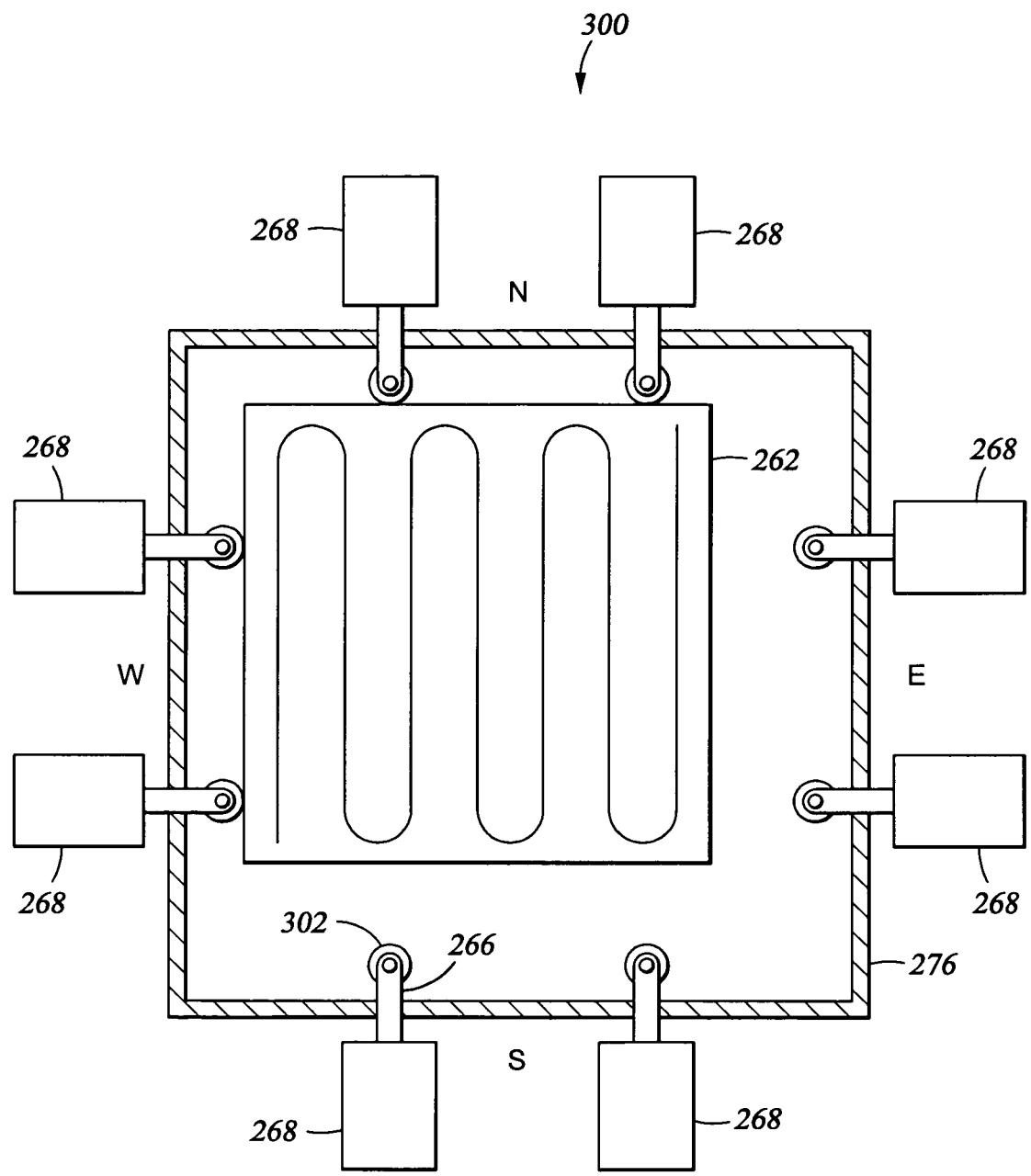
FIG. 29 is a plan view of a second embodiment of a two-dimensional scan mechanism.

A rectangularly arranged scanning mechanism 300, illustrated in FIG. 29, includes eight actuators 268 arranged in pairs along the four sides of the rectangular frame 276 and having respective wheels 302 or other rotatable member on the end of the push rod 266 engaging the perpendicular frames sides at the corner. Soft pusher pads, for example of Teflon, may be substituted for the wheels 302. The paired actuators 268 are controlled in a same manner to execute a same extension of the associated push rods 266. The pairing is preferred when the there is no fixed coupling between the actuators 268 and the magnetron plate 262 but only a pushing force is executed. Only a pair of wheeled actuator pusher rods 266 need to engage the magnetron plate 262 to move it along a Cartesian direction.

Figure 30:
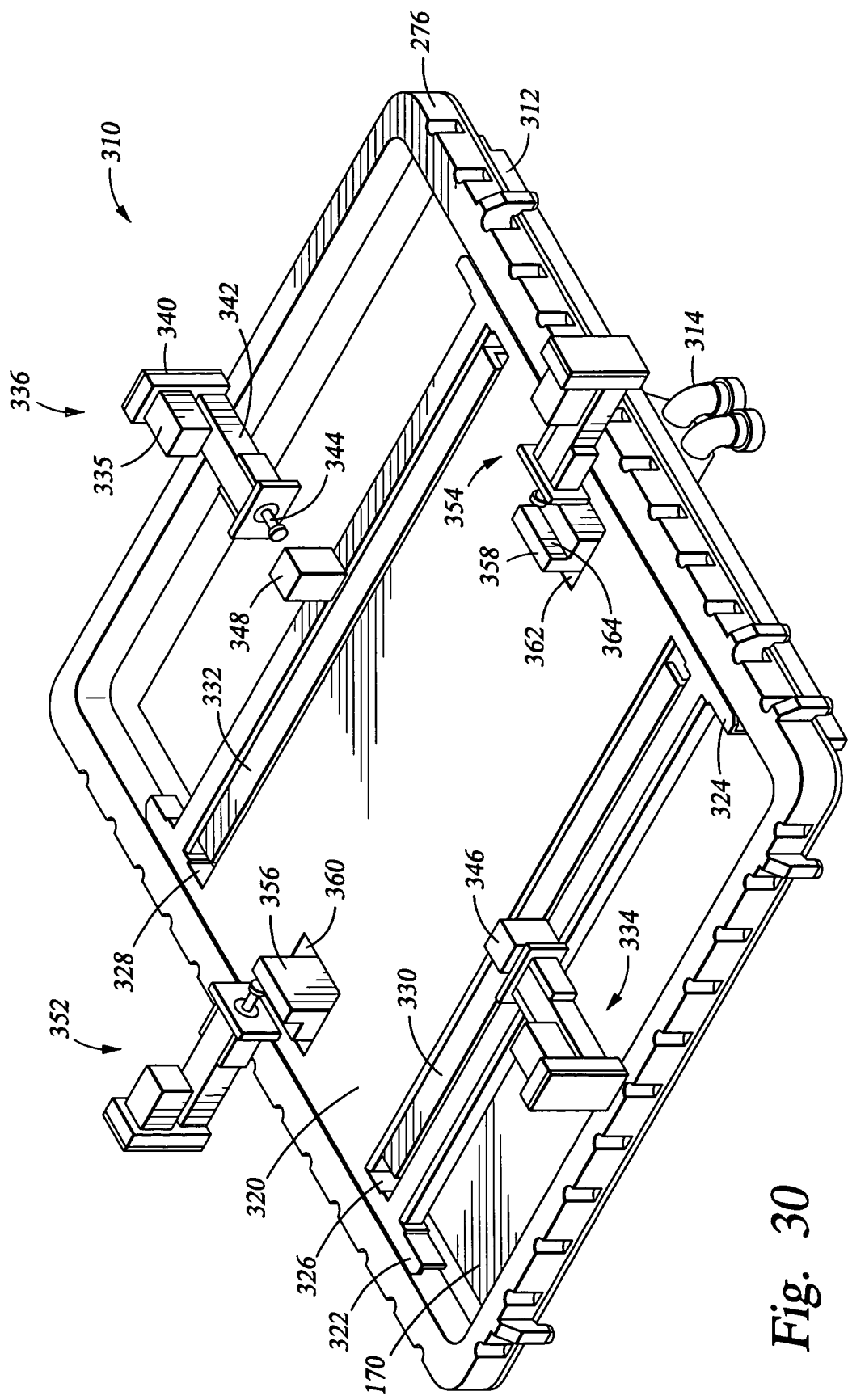
FIG. 30 is an orthographic view of a third embodiment of a two-dimensional scan mechanism and a support structure for the magnetron.

Another, overhead scan and support mechanism 310, illustrated orthographically in FIG. 30, is supported on the frame 276, which in turn is supported on the periphery of the target backing plate. A cooling manifold 312 distributes cooling fluid from supply lines 314 to the target backing plate. Corresponding drain manifold and drain lines on the opposed side are not illustrated. Tanase et al. have described an improved cooled backing plate and manifolds in patent application Ser. No. 11/190,389, filed Jul. 27, 2005, incorporated herein by reference. The Tanase cooling plate has cooling holes laterally drilled in an integral backing plate with cooling liquid manifolds disposed on the planar surface and creating counter-flowing cooling liquid in the plate. The Tanase reference also teaches that the multi-tile target, though generally rectangular, may have corners following the outer plasma track. A slider plate 320 includes two inverted side rails 322, 324 which slide in a first direction along and on top of respective series of wheel bearings mounted on the frame 276. Two slots 326, 328 are formed in the slider plate 320 to extend in the perpendicular second direction. Two inverted rails 330, 332 fixed to and supporting the magnetron plate 170 extend through the two slots 326, 328 and are slidably supported on respective series of wheel bearings mounted on the slider plate 320 to allow motion in the second direction. That is, the magnetron plate 170 and associated magnetron can slide in the perpendicular first and second directions. Further, the heavy magnetron is supported on the frame 276 and the periphery of the target backing plate, itself directly supported on the chamber wall, and not on the relatively thin cantilevered inner portions of the target and target backing plate. In U.S. patent application Ser. No. 11/347,667, filed Feb. 3, 2006 and incorporated herein by reference, Inagawa et al. disclose a suspension system in which the magnetron plate 170 is partially supported by the rails 330, 332 through springs and partially on the target backing plate through rollers. That is, the Inagawa system combines features of FIGS. 24 and 30.

A first set of actuators 334, 336 opposed along the direction of the slider rails 322, 324 are supported on the frame 276 and include respective independently controlled bidirectional motors 338, 340, and worm gears 342 driving pusher rods 344, which selectively abut, engage, and apply force to respective bosses 346, 348 extending upwardly from the slider plate 320. A second set of similarly configured actuators 352, 354 opposed along the direction of the magnetron plate rails 330, 332 are supported on the frame 276 to selectively engage respective bosses 356, 358 fixed to the magnetron pate 170 and extending upwardly and passing through windows 360, 362 in the slider plate 320. The windows 360, 362 are sized significantly larger than the associated bosses 356, 358 to allow the bosses 356, 358 to move the total scan distances in the two orthogonal directions.

The opposed pairs of actuators 334, 336, 352, 354 can be used to move the magnetron plate 170 and attached magnets in orthogonal directions. The bosses 356, 358 fixed to the magnetron plate 170 have relatively wide faces 364 so that the pushers rods 344 of the associated actuators 352, 354 can slidably engage them as the other set of actuators 334, 336 are moving the magnetron plate 170 in the transverse direction.

Figure 31:
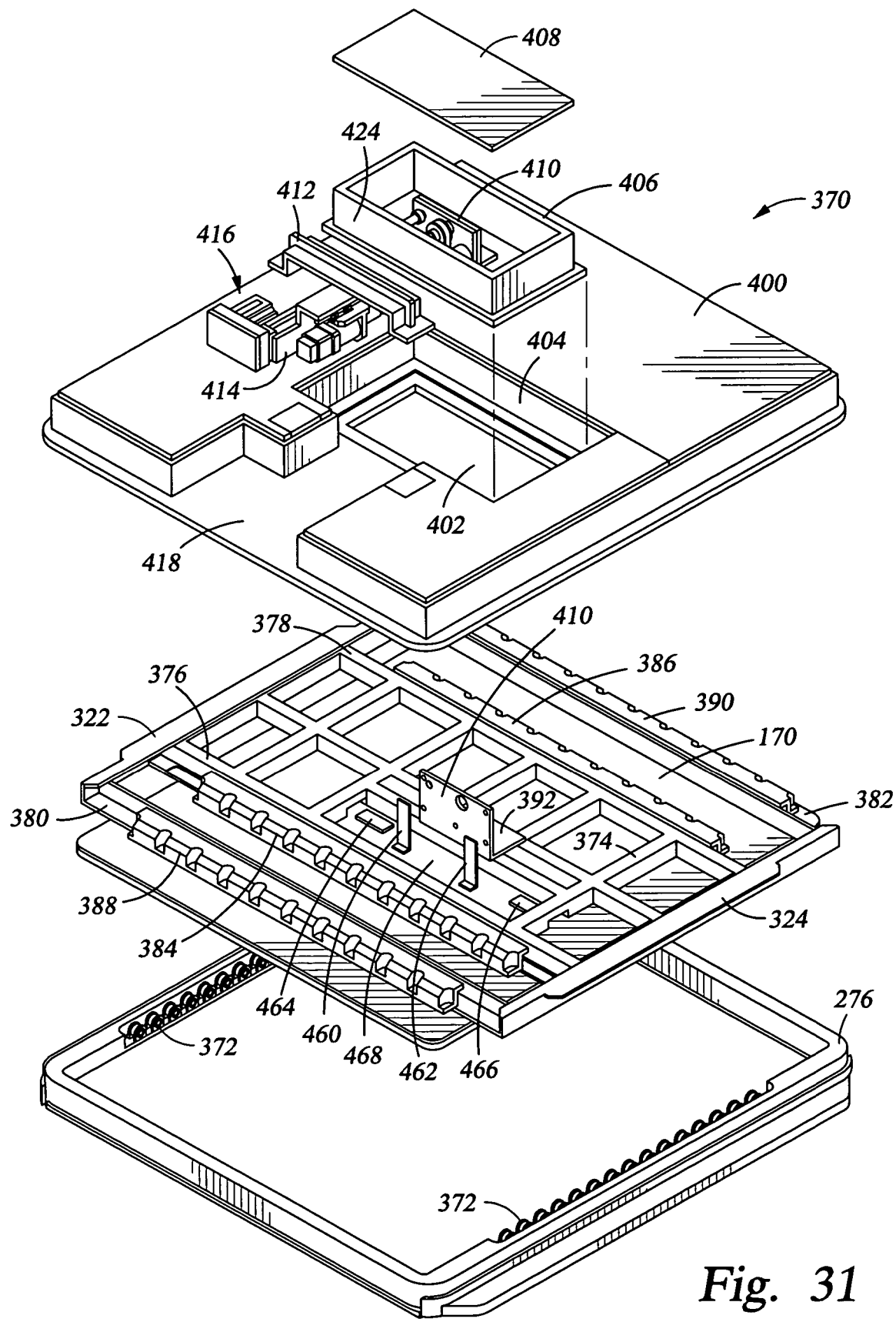
FIG. 31 is an exploded orthographic view of a fourth embodiment of a two-dimensional scan mechanism.

Yet another scan and support mechanism 370 illustrated in the exploded orthographic view of FIG. 31, provides some improvements over that of FIG. 30 and is more completely illustrated. The frame 276 supports two rows of rollers 372 on opposed sides of the frame, which rollably support the inverted frame rails 322, 324 supporting a gantry 374 between them. The gantry 374 has a more open lattice structure than the slider plate 320 of FIG. 30 but provides much the same function. The gantry 374 includes four unillustrated rows of rollers on inner struts 376, 378 and outer struts 380, 382. The four struts rollably support inverted gantry inner rails 384, 386 and outer rails 388, 390. The gantry rails partially support the magnetron plate 170 including magnets on its lower side. The outer struts 380, 382 and outer rails 388, 390 are optional but provide additional support on the sides of the heavy magnetron plate 170 to reduce the amount of droop near the edges in comparison to the two-rail support of FIG. 30. A bracket-shaped base plate 392 is fixed to the frame structure forming the gantry 374.

Figure 1:
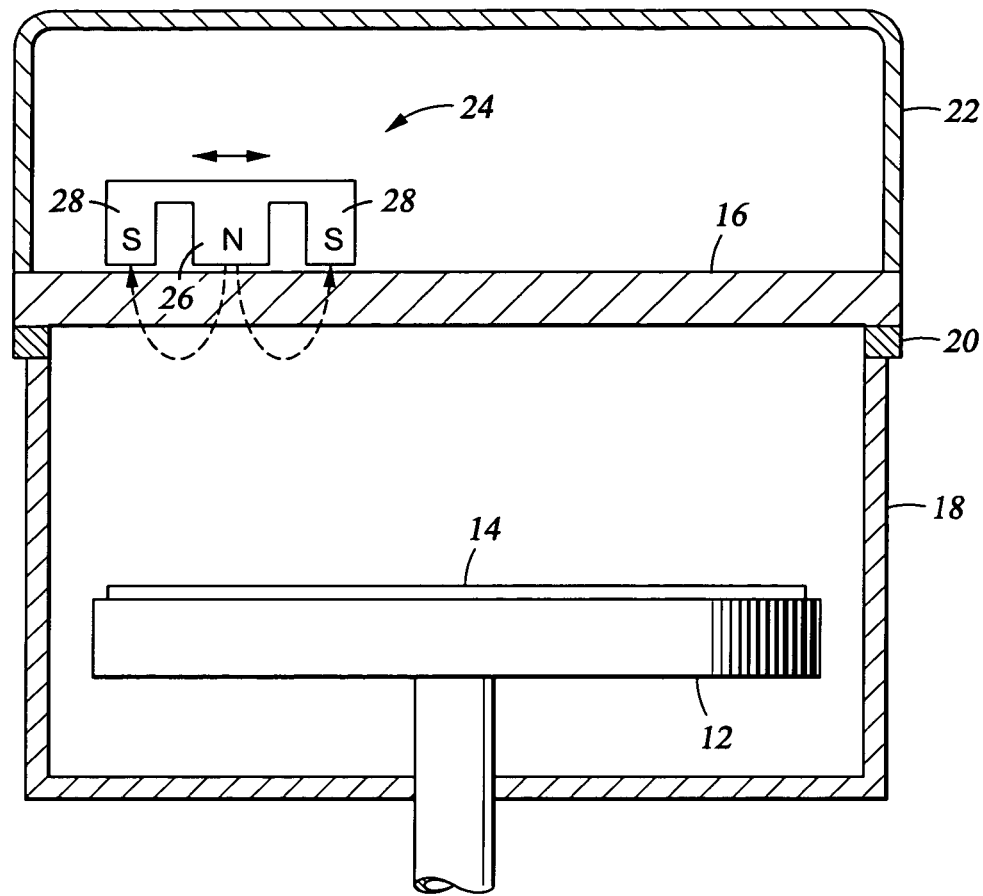
FIG. 1 is a schematic side view of a convention plasma sputter reactor configured for sputter depositing onto a rectangular flat panel.

A magnet chamber roof 400, which forms the top wall of the back chamber 22 of FIG. 1, is supported on and sealed to the frame 276 with the gantry structure disposed between them and provides the vacuum wall over the top of the chamber accommodating the magnetron. The magnet chamber roof 400 includes a rectangular aperture 402 and the bottom of a bracket recess 404. A bracket chamber 406 fits within the bracket recess 404 and is sealed to the chamber roof 400 around the rectangular aperture 404. A top plate 408 is sealed to the top of the bracket chamber 406 to complete the vacuum seal.

A gantry bracket 410 movably disposed within the bracket chamber 406 is fixed to the base plate 392 of the gantry 374. A support bracket 401, which is fixed to the exterior of the magnet chamber roof 400, and an intermediate angle iron 414 holds an actuator assembly 416 in an actuator recess 418 in the roof 400 outside the vacuum seal. The support bracket 412 further acts as part of the truss system in the magnet chamber roof 400. The actuator assembly 416 is coupled to the interior of the bracket chamber 406 through two sealed vacuum ports.

The actuator assembly 416 independently moves the gantry 374 in one direction by force applied through the gantry bracket 410 fixed to the gantry's base plate 392 and moves the magnetron plate 170 in the perpendicular direction by a belt drive with a belt having its ends fixed to the magnetron plate 170.

Figure 32:
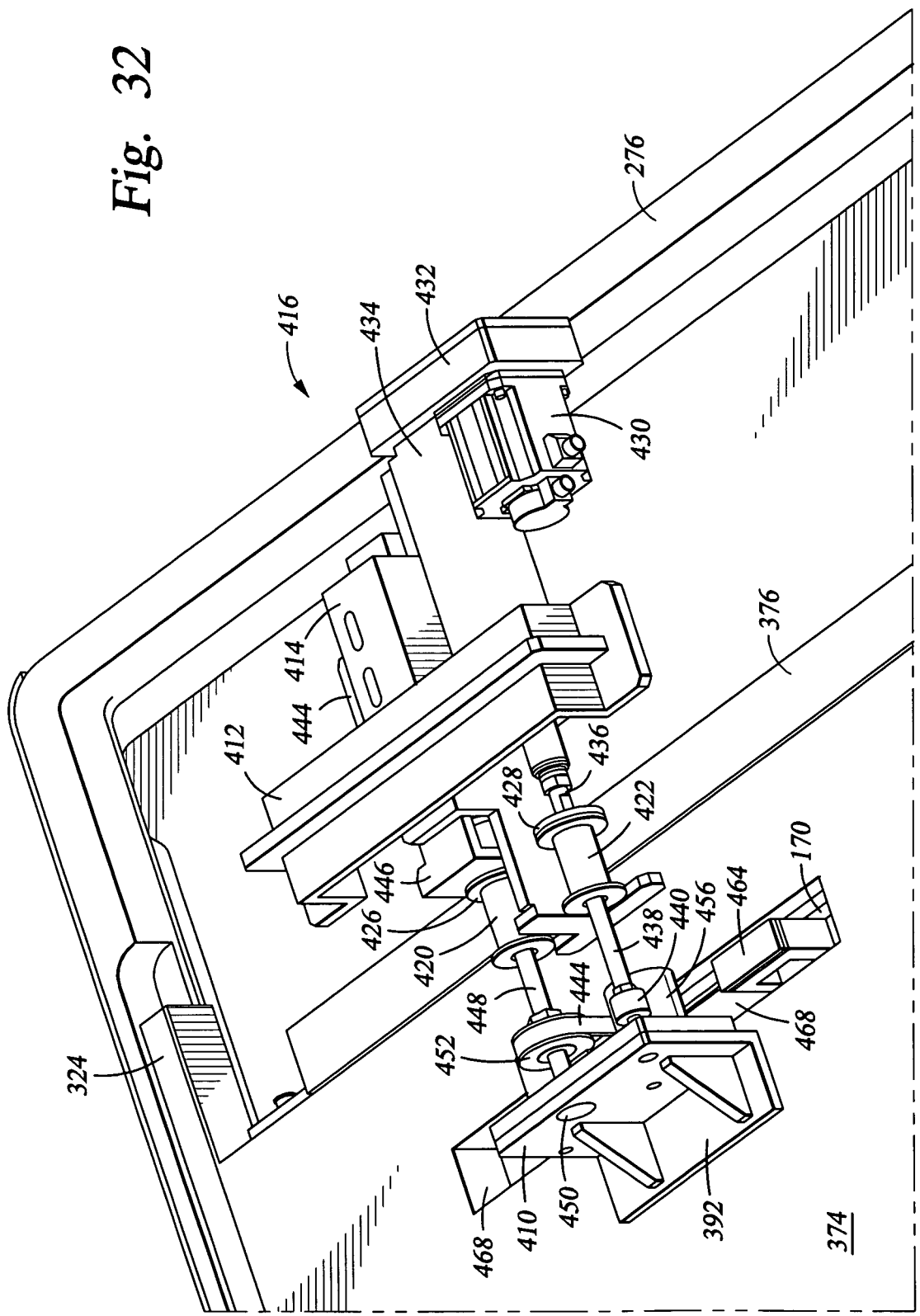
FIGS. 32 and 33 are detailed orthographic views of the actuators portions the scan mechanism of FIG. 31.

The actuator assembly 416, as illustrated in the detailed orthographic view of FIG. 32, includes two actuators which are coupled into the interior of the bracket chamber 406 through two sealed ports including respective bellows 420, 422 penetrating a sidewall 424 of the bracket chamber 406 of FIG. 31. The bellows 420, 422 are respective axially corrugated integral tubular members of sufficient elasticity to allow expansion along the actuator axes of a distance as great as the scan distance along the frame side rails 322, 324. The bellows 420, 422 have one end sealed around apertures in the sidewall 424 and another end having a respective vacuum sealed cap 426, 428.

Figure 33:
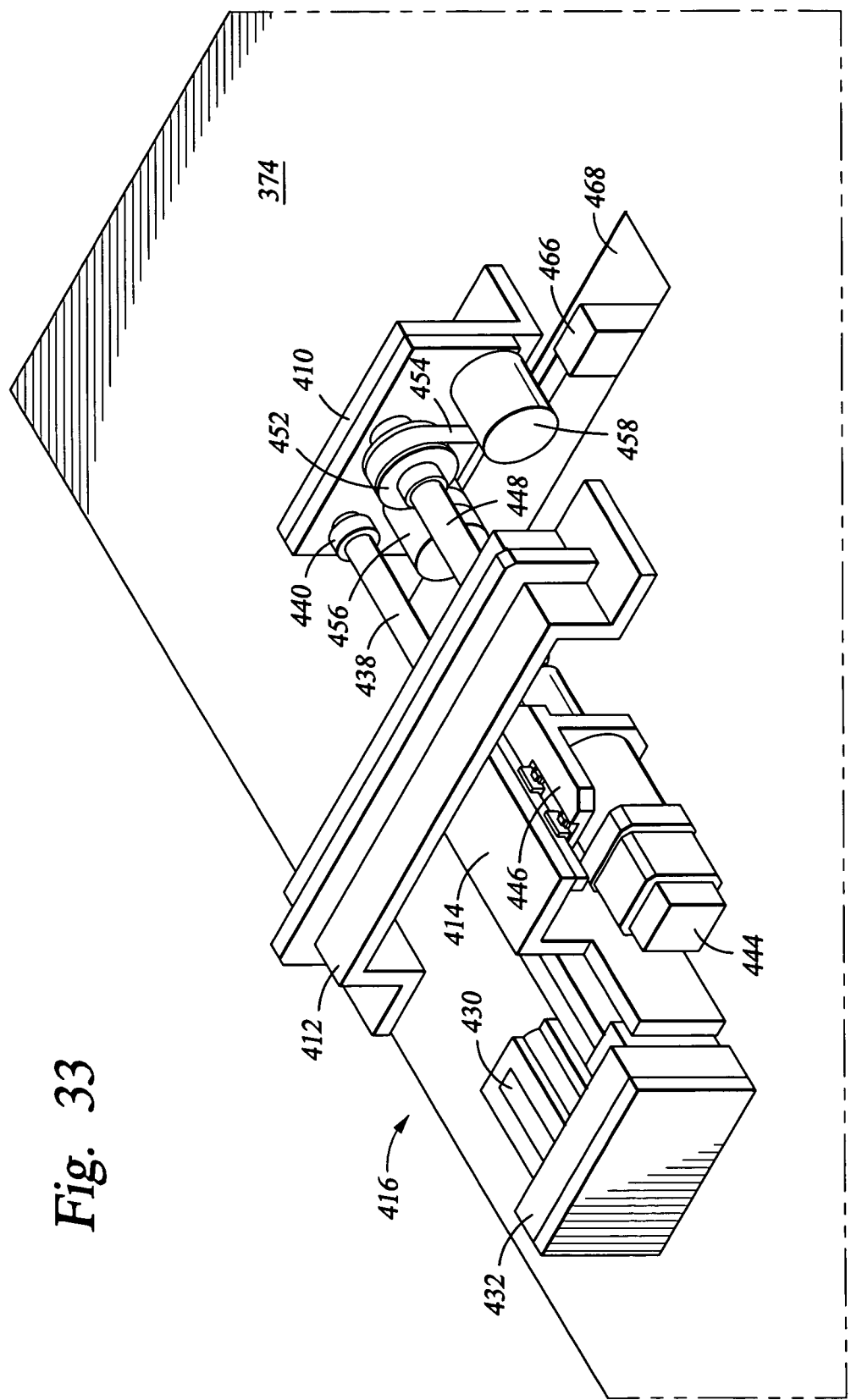

The actuator assembly 416, also illustrated from the opposite lateral side in the orthographic view of FIG. 33, includes two actuators for the two perpendicular motions. This figure includes the actuator assembly 416 and the gantry 374 but not the intermediate magnet chamber roof 400. FIGS. 32 and 32 both illustrate a plate structure for the gantry 374 rather than the frame structure of FIG. 31.

A linear actuator in the actuator assembly 416 includes a first stepper motor 430, a gear box 432, and a worm gear 434. An actuator rod 436 linearly driven by the worm gear 434 is connected to the end cap 428 of the bellows 422, which is solid. A push rod 438 connected to the other side of the end cap 428 is fixed to the gantry bracket 410 through a screwed fixture 440. However, other linearly vacuum ports are possible. For example, the lead screw mechanism could be incorporated into a lead nut rotating in the gantry bracket 410 and a lead screw formed in the end of a rotary output shaft of the first stepper motor 430 penetrating into the vacuum chamber through a rotary seal.

A rotary actuator in the actuator assembly 416 includes a second stepper motor 444 supported on the angle iron 414 through a linear slide 446 and having a rotary output shaft 448, which penetrates the sealed bracket chamber sidewall 424 through the other bellows 420, which includes a rotary seal in its end cap 426 for the rotary shaft 448. The linear slide 446 allows the second stepper motor 444 and its output shaft 448 to move along the axis of the rotary shaft 448 relative to the roof 400 and frame 276. Other means are possible for the vacuum port transmitting linear and rotational movement. The other end of the rotary shaft 448 is supported by a bearing 450 held in the gantry bracket 410. The rotary shaft 448 holds a toothed pulley or capstan 452, round which is wrapped a ribbed belt 454. Two pulleys or rollers 456, 458 rotatably supported on the base pale 392 or on two stanchions 460, 462 mounted on the magnetron plate 170 lead the belt 444 downwardly and then outwardly towards its two ends, which are fixed respectively to two pedestals 450, 452, which are fixed to the magnetron plate 170 and extend upwardly through a window 468 in the gantry 364. The belt structure can be replaced by other structures. For example, a pinion gear on the rotary shaft 438 may engage a toothed rack on the magnetron plate 170.

In combination, the linear actuator causes the gantry 374 to move along the direction of the frame side rails 322, 324 and the rotary actuator causes the magnetron plate 170 to move along the perpendicularly oriented directions of the struts 376, 378, 380, 382 fixed to the gantry 374.

The scan mechanism 370 of FIGS. 31-33 provides a fixed connection between the two actuators and the magnetron plate 170 to provide for respective independent perpendicular bidirectional movements in contrast to the unidirectional or sliding connections or contact of the other embodiments, which require four or more actuators for full perpendicular movements.

The sputter chamber of FIG. 1 is typically controlled by an unillustrated computerized control system operating in accordance with a recipe set for processing a sequence of panels 14. The control system controls a DC power supply powering the target 16, a vacuum pumping system pumping the interior of the sputtering chamber 18 and the back chamber 22 to desired low pressures, a slit valve connecting the chamber interior to a transfer chamber, and a robot disposed principally within the transfer chamber to transfer substrates 14 in and out of the sputtering chamber 18. The control system is additionally connected to the actuators of the various embodiments to scan the large magnetron in a desired 2-dimensional pattern in back of the target 16.

Figure 34:
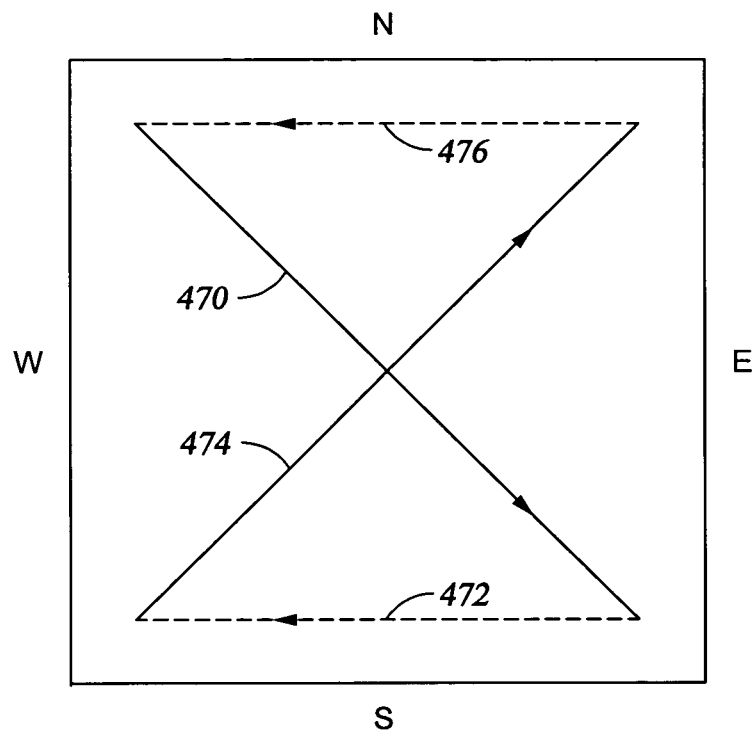
FIG. 34 is a map of a double-Z scan path.

Multiple actuators may be controlled in combination to effect a desired scanning pattern. One mode of simultaneous operation smoothly follows the diagonal scan inherent in the apparatus of FIG. 25, for example, northwest to southeast although a southwest to northeast scan is also possible. A second mode of operation improves the erosion uniformity by scanning, as illustrated in the map of FIG. 34, a complete double-Z pattern by performing a first diagonal scan 460 along one diagonal direction and extinguishing the plasma (or reducing the target power) near the end of the diagonal scan 470. Thereafter, the magnetron is scanned near the target edge along a rectilinear path 472 parallel to one Cartesian coordinate with the plasma extinguished or lessened. Then, a second diagonal scan 474 with active plasma is performed along the other diagonal but the plasma is extinguished near the end of the second diagonal scan 474. Finally, the magnetron is scanned back along a rectilinear scan 476 near the other target edge and anti-parallel to the one Cartesian (rectangular) coordinate with the plasma extinguished. This pattern will be referred to as a double-Z. It is noted that the indicated paths extend only over the scan dimensions, e.g. 75 or 1100 mm, and not over the entire target having sides about 10 times or more larger. That is, the magnetron has an effective magnetic field extending within an area with sides that are 80% or 90% or even greater of the corresponding dimensions of the target within the frame. With reference to a serpentine magnetrons 60, 80 of FIGS. 5 and 6, the double-Z scan can be performed so that the edge scans 472, 476 are performed either parallel to the principal set of straight sections 68 or perpendicular thereto. For spirally wrapped magnetrons, the choice of edges is not so important.

The double-Z scan can be performed for a single substrate. Alternatively, a fresh substrate can be substituted during each of the rectangular scans 472, 476 while no plasma is excited and the chamber pressure and gaseous ambient are relatively unimportant. If the size of the double-Z pattern is small enough so that edge effects are avoided in the edge paths 472, 476 in the presence of a plasma, an advantageous scan pattern starts at the center at which the plasma is ignited. The plasma remains ignited while the magnetron is scanned through the complete double-Z pattern, finally ending back at the center. The plasma ignition thus occurs at the maximum distance from any portion of the grounded frame 276.

Figure 35:
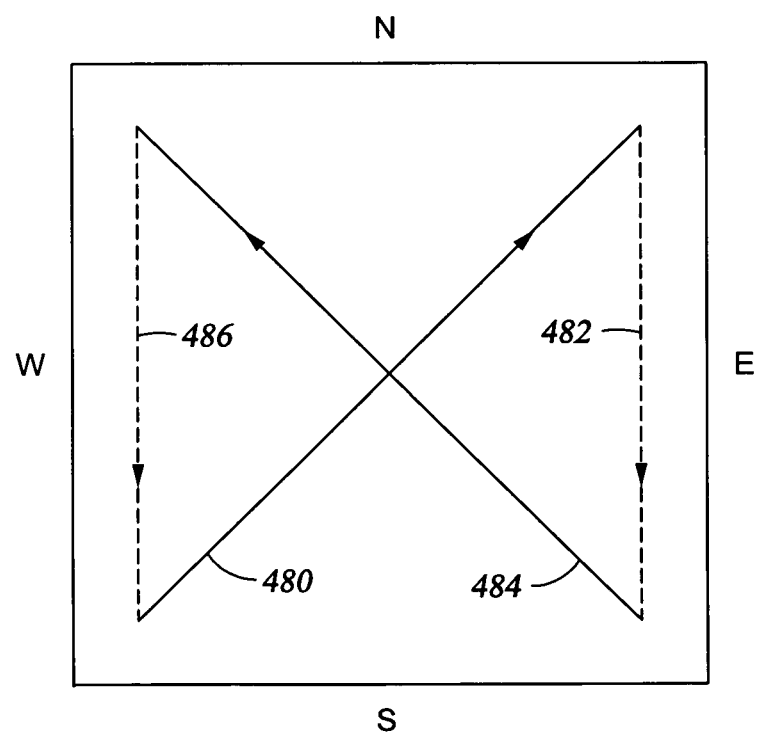
FIG. 35 is a map of another double-Z scan path rotated 90° from that of FIG. 34 and performed alternately therewith.

The double-Z scan and other types of scan need not be precisely replicated from one step to the next. Target erosion uniformity, which determines target lifetime, can be improved by alternating the double-Z scan of FIG. 34 with a rotated double-Z scan illustrated in the map of FIG. 35, which similarly has two diagonal scans 480, 484 and two rectilinear scans 482, 486 but the double-Z pattern is rotated 90° from the double-Z pattern of FIG. 34. Particularly, when the plasma is ignited during the rectilinear scans 482, 486, the rotated double-Z scan erodes portions of the target not effectively scanned in the first double-Z scan of FIG. 34.

Figure 36:
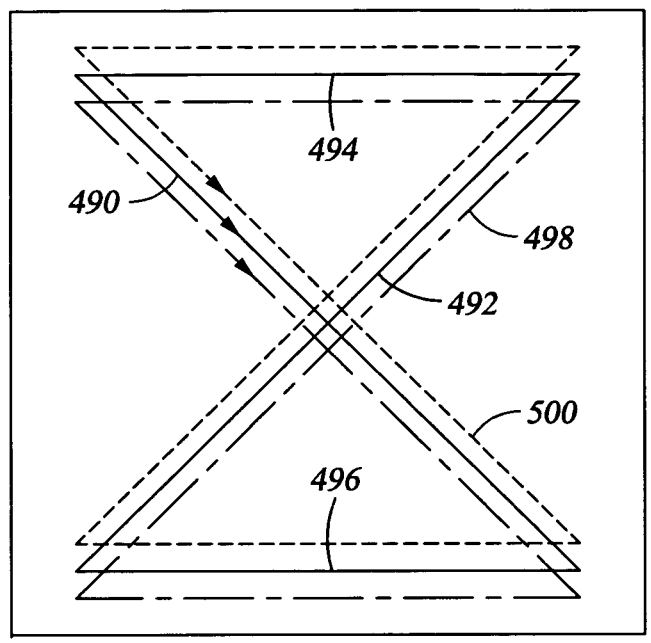
FIG. 36 is a map of a path for a sequence of offset double-Z scans.

Target erosion uniformity can be also improved by offsetting sequential double-Z scans in one or two directions. For example, as illustrated in the map of FIG. 36 after a first, baseline double-Z scan with diagonal scans 490, 492 and edge scans 494, 496, the pattern is displaced along one Cartesian coordinate by a small distance, for example, 10 mm, and preferably perpendicular to the edge scans 494, 496 for performance of a second double-Z scan 498. A range for the offset is 5 to 15 mm, preferably 8 to 12 mm. Further uniformity is achieved by an equal displacement in the opposite direction from the baseline scan for performance of a third double-Z scan 500. Thereafter, the scan pattern may return to the baseline scan. Further offset values may be used. The various parts of the complete scan may be performed for deposition onto one substrate or onto multiple, sequentially inserted substrates. One complete double-Z scan is advantageously performed in sputter depositing on one substrate and a subsequent displaced double-Z scan is performed on a subsequent substrate.

Figure 37:
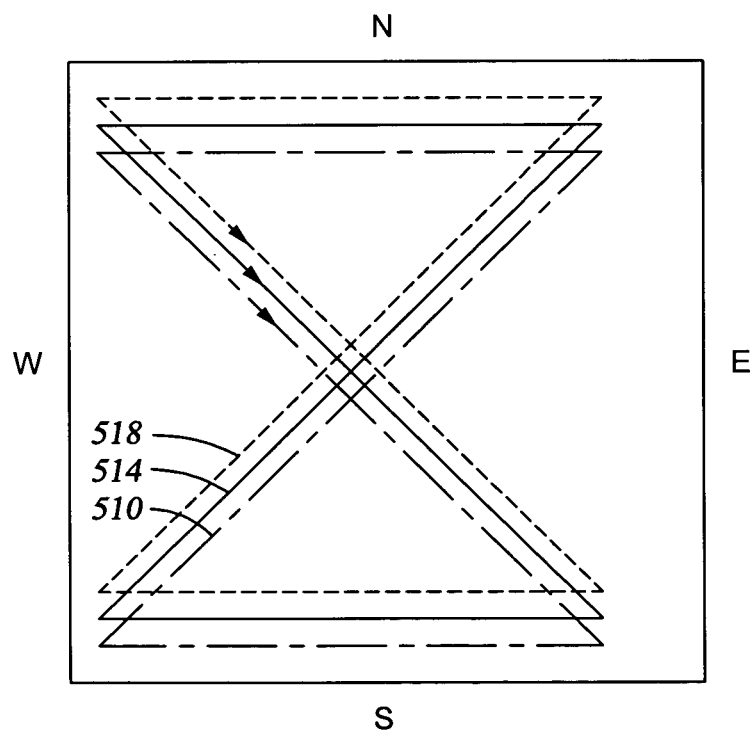
FIGS. 37 and 38 contain a map of a path of a sequence of double-Z scans offset in orthogonal directions.
Figure 38:
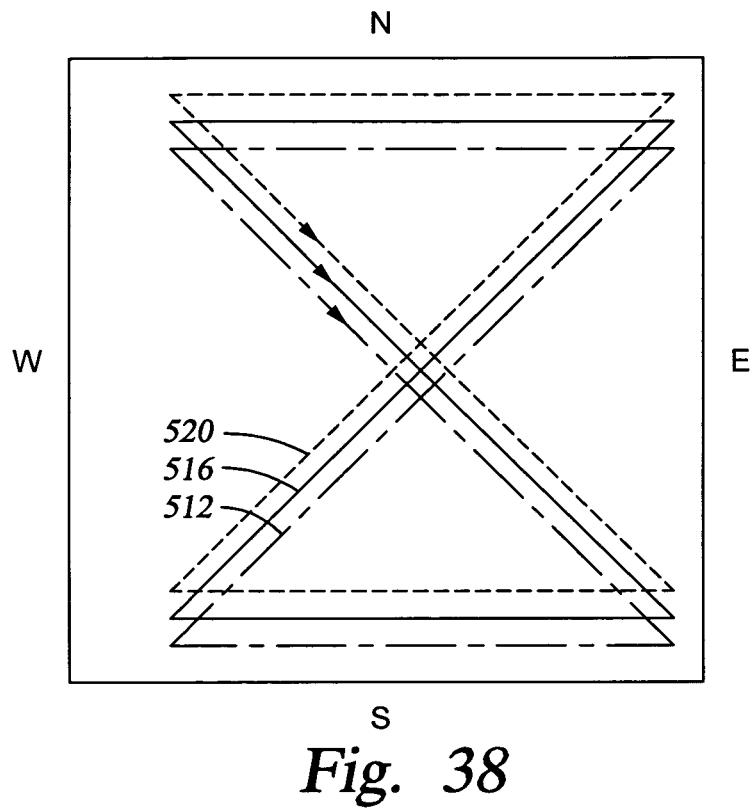

The displacement of double-Z scans may be performed in two directions as illustrated in the map sequentially illustrated FIGS. 37 and 38. Although the exact sequence is not crucial, a first double-Z scan 510 of FIG. 37 includes the nearest usable point to the southwest corner and does not extend all the way to the usable area on the east side. A second double-Z scan 512 of FIG. 38 is displaced toward the east side to include the nearest usable point to the southeast corner. In one method of sputtering, each of the double-Z scans 510, 512 is used for one panel to be sputter coated. Returning to FIG. 37, a third double-Z scan 514 is displaced toward the north side from the first double-Z scan 510. For example, the second scan 514 may be displaced a distance Z in the x-direction from the first scan 510 and the third scan 514 may be displaced a same or different distance Z in the y-direction from the first scan 510. The process is then repeated for fourth, fifth, and sixth double-Z scans 516, 518, 520. The process may then continue for additional double-Z scans, for example, ten total scans, until the nearest usable points to both the northwest and northeast corners are scanned. It is also possible to have more than two displacements from west to east.

Figure 39:
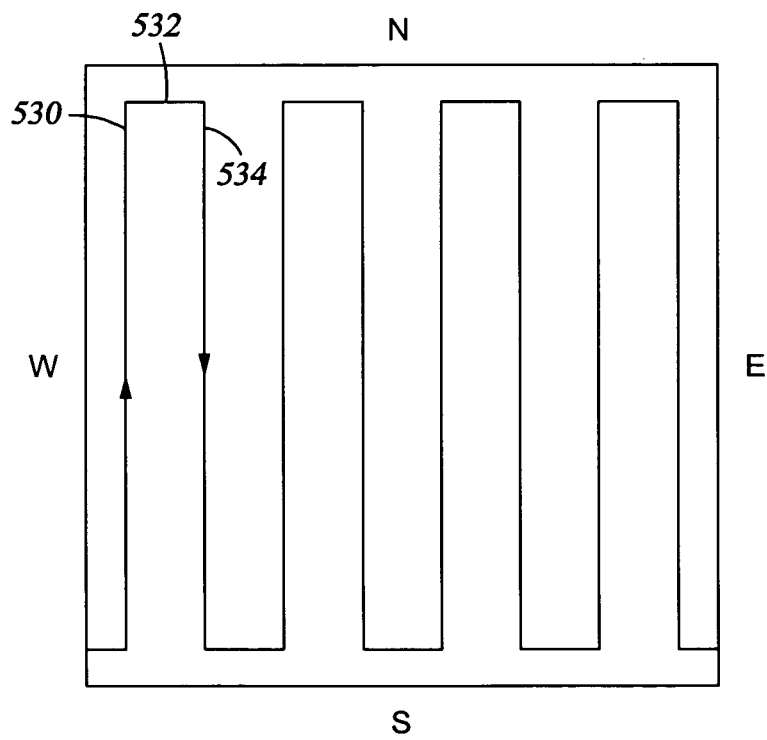
FIG. 39 is a map of a serpentine scan path.

A single double-Z scan may take about one minute, which is sufficient for layers sputtered to a thickness of, for example, 1 µm. However, there are some layers which need to be deposited to a much reduced thickness. One advantageous scan pattern, especially for short deposition times is the serpentine pattern of FIG. 39. A first linear scan 530 extends along one side of total scan area between two opposed sides during which the plasma is turned on and sputter deposition occurs. The first linear scan 530 may be short enough to sputter coat the required thickness on a first panel. The scan is then displaced in the perpendicular direction in a first perpendicular scan 532 along a second side of the total scan area perpendicular to the first side. The perpendicular scan 532 may be performed with the plasma extinguished and while a second panel replaces the first panel in the sputter chamber. Then a second linear scan 534 anti-parallel to the first linear scan 530 is performed with the plasma turned on to sputter coat the second panel with the same thin layer of sputtered material. The plasma is turned off while the scan is again displaced in the perpendicular direction and a third panel replaces the second panel in the sputter chamber. The process continues until the useful scanning area is exhausted. The process then repeats, either from the beginning point or retracing the previous scan in the reverse direction or some other similar scan path, including interchanging the directions of the linear and perpendicular scans.

Figure 40:
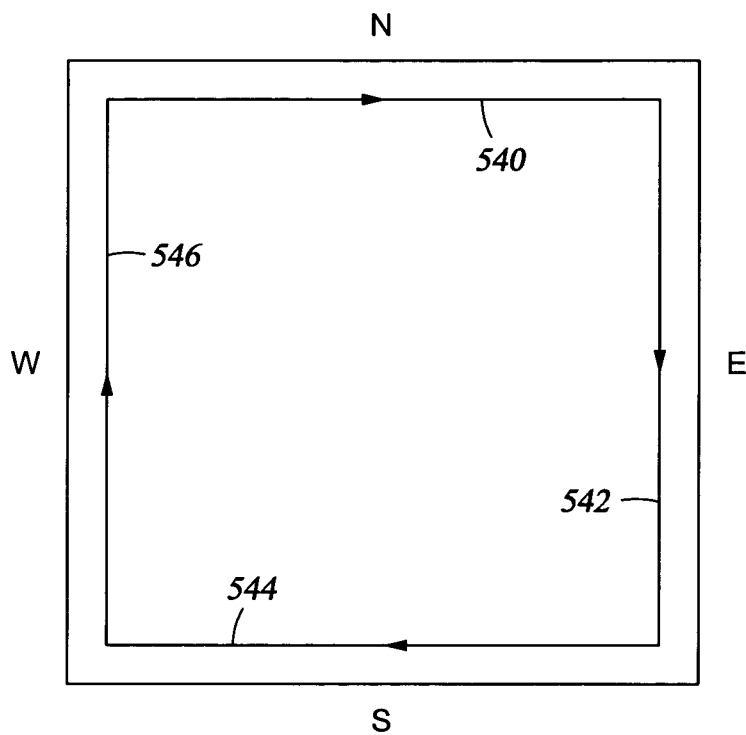
FIG. 40 is a map of a rectangular scan path.

A simpler Cartesian scanning pattern, illustrated in the map of FIG. 40, follows a closed rectangular pattern having four sides 540, 542, 544, 546 arranged with 90° corners between them in what may be described as an O-pattern. When used in conjunction with a serpentine magnetron having long sections arranged parallel to the east and west sides 542, 546, it may be advantageous to turn off the plasma while scanning the east and west sides 542, 546 and turn it on while scanning the north and south sides 540, 546. Alternatively, the plasma may be excited to a higher intensity in scanning the north and south sides 540, 544 while excited to a lesser intensity in scanning the east and west sides 542, 546. This type of differential powering provides a fairly uniform deposition pattern on the panel and more uniform erosion of the target.

Figure 41:
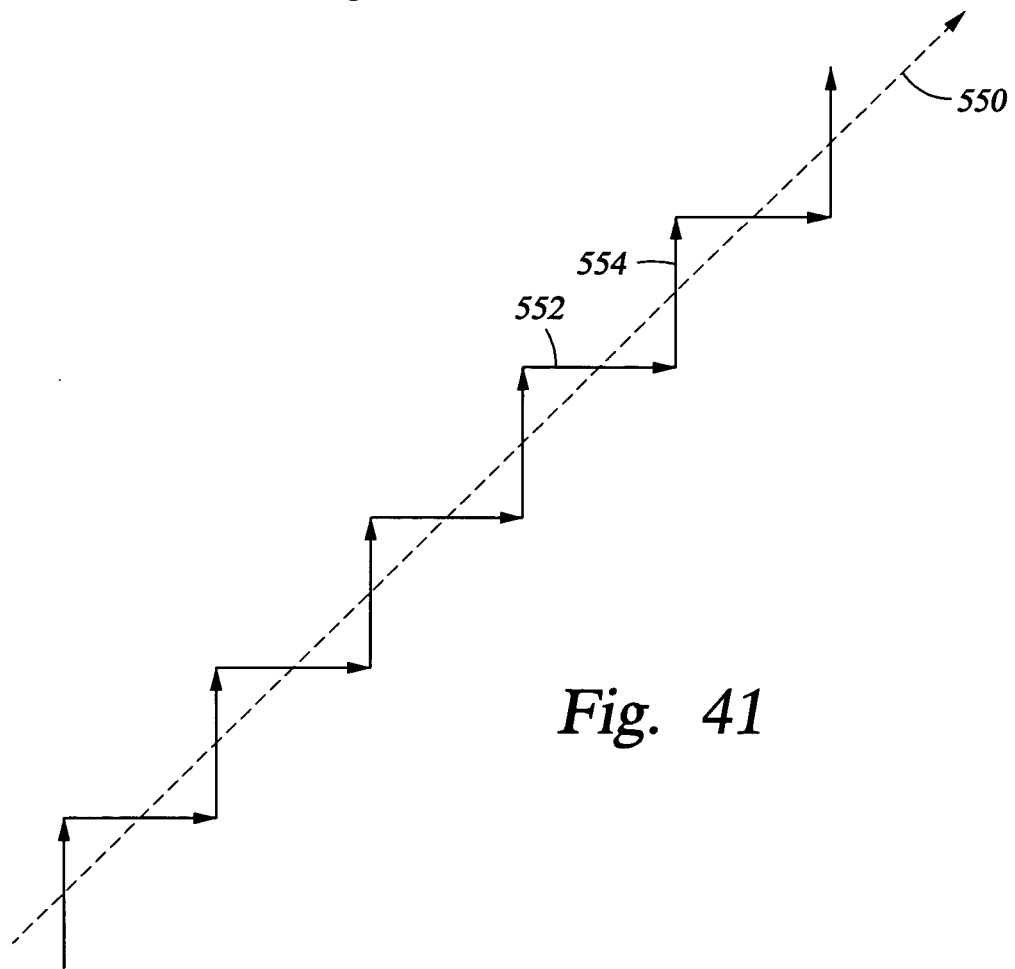
FIG. 41 is a map of a zig-zag diagonal scan path.

It is possible to simultaneously activate two perpendicularly arranged actuators to cause the magnetron to move along a diagonal path 550 illustrated in FIG. 41. However, in some situations it is instead preferred to follow a zig-zag path consisting of small movements 552 along one Cartesian coordinate alternating with small movements 554 along the other, perpendicularly arranged Cartesian coordinate. For example, each movement 552, 554 may be about 1 mm. A range of lengths of the movements 552, 554 is 0.4 to 3 mm, preferably 0.8 to 1.2 mm. If the diagonal path 550 is not arranged at 45° with respect to the Cartesian coordinates, the movements 552, 554 may have different lengths between them to approximate the diagonal scan 550. If it is difficult to provide the precise ratio of perpendicular movements, for example, with a stepper motor, then different movements in the same direction may have different lengths that on average produce the overall path 550 in the desired direction. This alternating movement achieves a larger effective scan area to increase the sputtering uniformity. The alternating movement is further advantageous with the perpendicularly arranged pushing actuators of FIG. 30. In this situation, simultaneous movement in perpendicular directions cause at least one of the rod contacts to slide against the magnetron plate or the boss or gantry bracket. In contrast, with the alternating movement, the actuator not being used can be backed away from the magnetron plate so as to not contact the magnetron plate as it moves laterally past.

Figure 42:
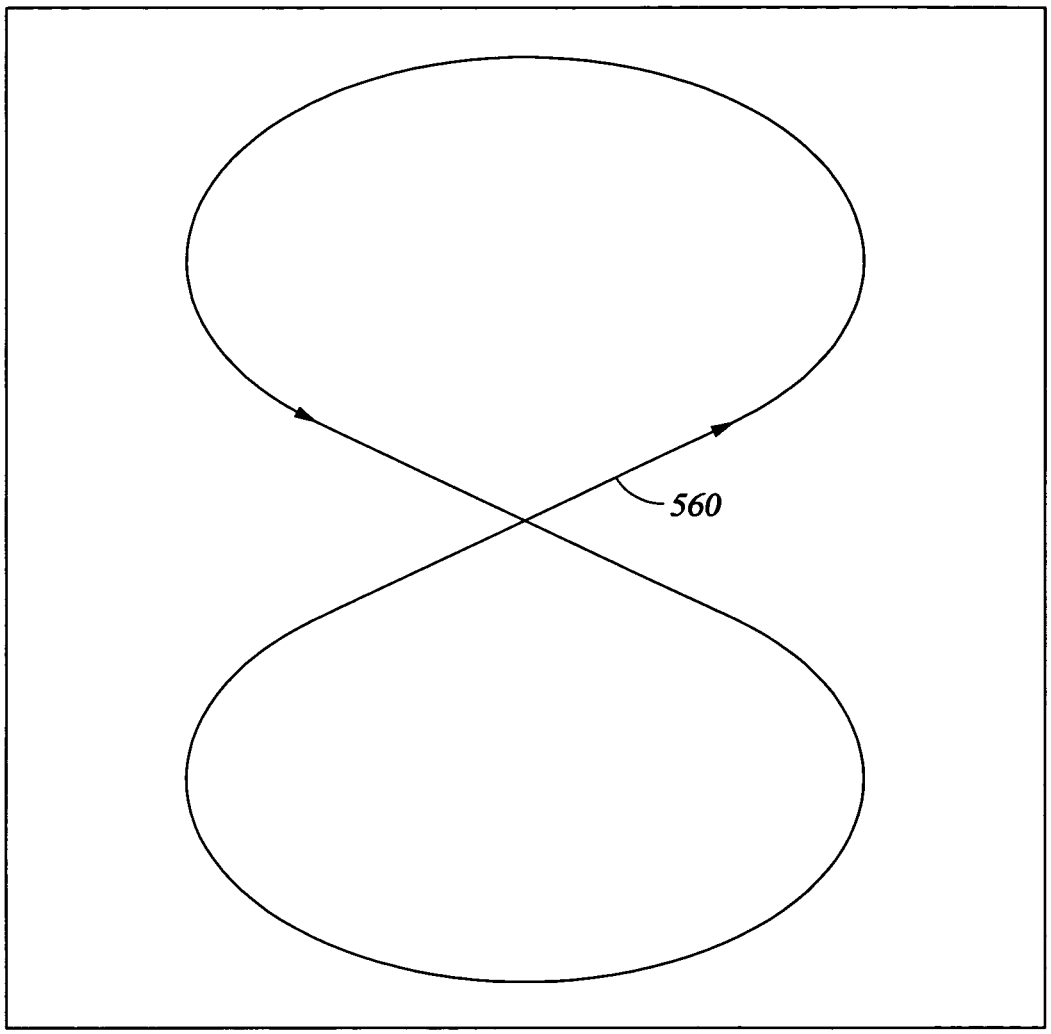
FIG. 42 is a map of a FIG. 8 scan path as an example of a two-dimensional curved scan path.

The full set of actuators allow more complex, nearly arbitrary scan patterns, possibly including curved portions. For example, a FIG. 8 scan 560 shown in FIG. 42 can be achieved by continuously varying the control of the four sets of pushing actuators or two bidirectional actuators operating in transverse directions. The FIG. 8 scan 560 is an example illustrating the nearly arbitrary scanning pattern achievable with the invention.

Experiments have demonstrated that rectangular targets can be substantially uniformly over a central area extending to within 150 mm of the frame. Uniformity in one direction can be extended by increasing the length of the straight portions of the serpentine magnetron while uniformity in the other direction is increased by the magnetron scanning.

Although the described embodiments involve a single scannable magnetron, many aspects of both the scanning apparatus and the scanning patterns may be applied to sputter reactors having multiple magnetrons each of which can be scanned separately and in large part independently. In particular, target utilization can be increased for many different forms of magnetrons. Similarly, the invention may be applied to magnetron assemblies having multiple separate magnetrons which are ganged and scanned together. Split magnetrons are especially useful when the target is divided into strips possibly with gaps between them and possibly including anode electrodes. Le et al describe multiple separately movable magnetrons for flat panel sputtering in U.S. patent application Ser. No. 11/146,762, filed Jun. 6, 2005, incorporated herein by reference.

Many of the advantages of the invention can be achieved if two-dimensional scanning or delayed plasma ignition is applied to a conventional magnetron composed of a plurality of parallel but independent linear magnetrons 24 of FIG. 2 formed with plural parallel inner poles 26 all surrounded by a single outer pole 32 with multiple parallel openings for the inner poles 26 and the respective plasma loops. However, the convolute single plasma loops of the serpentine and helical magnetrons of the invention are believed to provide more efficient and controllable sputtering.

The different aspects of the invention provides more uniform target erosion and sputter deposition with very large rectangular sputter targets. The convolute magnetrons are achievable with little increased cost. The two-dimensional scanning requires additional complexity in the scan mechanism, but the slow scanning, particularly along a reduced scan length with a large magnetron, reduces the bulk and cost of the scan mechanism.

The invention claimed is:

1. A sputtering magnetron arranged in a plane within a rectangular outline, including an outer pole of one magnetic polarity perpendicular to the plane surrounding an inner pole of opposed magnetic polarity with a gap therebetween, wherein said poles are arranged such that the gap forms a closed loop formed in more than two spiral wraps about a point within the plane.

2. The magnetron of claim 1, wherein the closed loop is formed in more than four said wraps.

3. The magnetron of claim 1, wherein the closed loop provides more than eight plasma tracks traversed by any line radiating outwardly from a center of the magnetron.

4. The magnetron of claim 1, wherein the closed loop is folded to form a folded loop and wherein the folded loop is wrapped about the point in more than two spiral wraps.

5. The magnetron of claim 1, further comprising magnets of opposed polarities forming said inner and outer poles, wherein said magnets in a central portion of the magnetron are substantially stronger than said magnets in an outer portion thereof.

6. The magnetron of claim 1, further comprising a scan mechanism for scanning the magnetron in a pattern extending in each of two dimensions over a distance at least as great as a separation of parallel portions of the gap in the closed loop.

7. The magnetron of claim 1, further comprising magnets of opposed polarities forming said inner and outer poles, wherein the magnets are positioned between at least two non-magnetic retainers coupled to a ferromagnetic back plate.

8. The magnetron of claim 7, wherein the at least two non-magnetic retainers form a convolute pattern therebetween.

9. The magnetron of claim 8, wherein the at least two non-magnetic retainers are configured to accommodate both a single row of cylindrical magnets and a double row of cylindrical magnets.

10. The magnetron of claim 9, wherein the at least two non-magnetic retainers comprise a plurality of straight retainers extending along perpendicular directions and corner retainers having curved portions connecting perpendicular ends of the straight retainers.

11. A sputtering magnetron arranged in a plane within a rectangular outline, including an outer pole of one magnetic polarity perpendicular to the plane surrounding an inner pole of opposed magnetic polarity with a gap therebetween, wherein said poles are arranged such that the gap forms a closed loop formed in more than two spiral wraps about a point within the plane, and wherein said poles are formed from cylindrical magnets of opposed polarities.

12. The magnetron of claim 11, wherein the magnets are positioned between at least two non-magnetic retainers coupled to a ferromagnetic back plate.

13. The magnetron of claim 12, wherein the at least two non-magnetic retainers comprise a plurality of straight retainers extending along perpendicular directions and corner retainers having curved portions connecting perpendicular ends of the straight retainers.

14. The magnetron of claim 13, wherein an outermost straight retainer is adapted to retain a single row of cylindrical magnets, and one or more interior straight retainers are adapted to retain a double row of cylindrical magnets.

15. The magnetron of claim 14, wherein one or more corner retainers are adapted to retain a double row of cylindrical magnets.

16. A sputtering magnetron arranged in a plane within a rectangular outline, including an outer pole of one magnetic polarity perpendicular to the plane surrounding an inner pole of opposed magnetic polarity with a gap therebetween, wherein said poles are arranged such that the gap forms a closed loop formed in more than two spiral wraps about a point within the plane, and wherein said poles are formed from cylindrical magnets of opposed polarities retained by at least two non-magnetic retainers coupled to a ferromagnetic back plate, the at least two non-magnetic retainers forming a convolute pattern therebetween.

17. The magnetron of claim 16, wherein the at least two non-magnetic retainers comprise a plurality of straight retainers extending along perpendicular directions and corner retainers having curved portions connecting perpendicular ends of the straight retainers.

18. The magnetron of claim 17, wherein an outermost straight retainer is adapted to retain a single row of cylindrical magnets, and one or more interior straight retainers are adapted to retain a double row of cylindrical magnets.

19. The magnetron of claim 18, wherein one or more corner retainers are adapted to retain a double row of cylindrical magnets.

* * * * *